US006845497B2

(12) United States Patent
Murai et al.

(10) Patent No.: US 6,845,497 B2
(45) Date of Patent: Jan. 18, 2005

(54) METHOD FOR FABRICATION OF PATTERNS AND SEMICONDUCTOR DEVICES

(75) Inventors: Fumio Murai, Hinode (JP); Hiroshi Fukuda, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 239 days.

(21) Appl. No.: 10/288,421

(22) Filed: Nov. 6, 2002

(65) Prior Publication Data

US 2003/0093767 A1 May 15, 2003

(30) Foreign Application Priority Data

Nov. 15, 2001 (JP) .................................. 2001-349569

(51) Int. Cl.[7] .............................................. G06F 17/50
(52) U.S. Cl. ................................................... 716/20
(58) Field of Search .................................. 716/19–21

(56) References Cited

U.S. PATENT DOCUMENTS

| | | | | | |
|---|---|---|---|---|---|
| 5,278,421 A | * | 1/1994 | Yoda et al. | ............ | 250/492.22 |
| 5,563,419 A | * | 10/1996 | Tamura | ................ | 250/492.22 |
| 5,808,310 A | * | 9/1998 | Yamashita et al. | ..... | 250/492.22 |
| 5,933,212 A | * | 8/1999 | Kasuga | ........................ | 355/20 |
| 6,243,487 B1 | * | 6/2001 | Nakajima | ................... | 382/144 |
| 6,370,441 B1 | * | 4/2002 | Ohnuma | ..................... | 700/121 |
| 6,484,300 B1 | * | 11/2002 | Kim et al. | ..................... | 716/7 |
| 6,546,543 B1 | * | 4/2003 | Manabe et al. | ............... | 716/21 |
| 6,657,210 B1 | * | 12/2003 | Muraki | .................. | 250/492.22 |
| 6,721,939 B2 | * | 4/2004 | Wang et al. | .................. | 716/21 |
| 6,775,817 B2 | * | 8/2004 | Ono et al. | .................... | 716/21 |
| 2002/0027198 A1 | * | 3/2002 | Nagata et al. | .............. | 250/307 |

FOREIGN PATENT DOCUMENTS

JP          3-225816          10/1991

OTHER PUBLICATIONS

Journal of Vacuum Science and Technology, vol. B9, No. 6, Nov./Dec. 1991, pp. 3048–3053.
Japanese Journal of Applied Physics, vol. 37, No. 12B, Dec. 1998, pp. 6767–6773.
Journal of Vacuum Science and Technology, vol. 819, No. 6, Nov./Dec. 1991, pp. 2483–2487.

* cited by examiner

*Primary Examiner*—Stacy A. Whitmore
(74) *Attorney, Agent, or Firm*—Mattingly, Stanger & Malur, P.C.

(57) ABSTRACT

Patterns for exposure are divided into subdivided regions taking into consideration a scope of an effect of backscattering, the Coulomb effect, and process factors, respectively, on errors in dimensions, and a pattern area occupancy ratio (pattern area density) within the respective subdivided regions is retained, thereby executing exposure with patterns after finding dimensions of pattern modification as the function of the respective pattern area densities. As a result, it becomes possible to fabricate a mask provided with correction for the errors in the dimensions, caused by plural factors such as backscattering, the Coulomb effect, and process factors, and to obtain highly accurate patterns for exposure. Further, use of pattern area density maps enables data processing time necessary for correction to be considerably reduced.

17 Claims, 11 Drawing Sheets

FIG.3A

| AREA DENSITY MAP | SUB-REGION SIZE | NATATION OF POSITION |
|---|---|---|
| SUB-FIELD MAP_C2A | 250 $\mu$m SQUARE | POSITION IN A CHIP $\longrightarrow (i,j)$ |
| LOCAL COULOMB EFFECT MAP_C1A | 50 $\mu$m SQUARE | POSITION IN A SUB-FIELD $\longrightarrow (k,l)$ |
| BACKSCATTERING MAP_PROX | 10 $\mu$m SQUARE | POSITION IN A SUB-FIELD $\longrightarrow (m,n)$ |

FIG.3B

| DEFLECTED SUB-FIELD POSITION | BEAM CURRENT OF A SUB-FIELD | ELECTRON BEAM BLUR |
|---|---|---|
| $(x,y)$ | $i_b * sf_{i,j}\_c2a$ | $\beta_{f1}$ |
| LOCAL COULOMB EFFECT | $i_b * sf_{i,j}\_c1a(k,l)$ | $\beta_{f2}$ |
| AREA DENSITY MAP | MAP_PROX$_{i,j}(m,n)$ | ENERGY BY BACKSCATTERING $\eta * $MAP_PROX$_{i,j}(m,n)$ |

FIG.3C $w = W/\beta_f$
$\Delta w = \Delta W/\beta_f$
$\alpha = $ MAP_PROX$_{i,j}(m,n)$ IN CASE OF LINE PATTERN
$erf(w + \Delta w/2) - erf(\Delta w/2) + \alpha * \eta = Es$ IN CASE OF CONTACT HOLE
$(1/4) \cdot \{erf(w + \Delta w/2) + erf(\Delta w/2)\}^2 + \alpha * \eta = Es$ STANDARD DEPOSITION ENERGY
$Es = (1/2) \cdot (1 + \eta)$

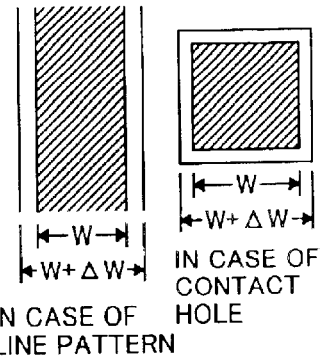

IN CASE OF LINE PATTERN

IN CASE OF CONTACT HOLE

SUB-FIELD
COULOMB EFFECT

LOCAL COULOMB
EFFECT WITHIN A
SUB-FIELD $\beta_{f1} = b_0 + \alpha_1(i,j) * i_b * b_1$ $\Delta \beta_{f2} = c_0 + \alpha_2(k,l) * i_b * c_1$ FIG.7A
FIG.7B
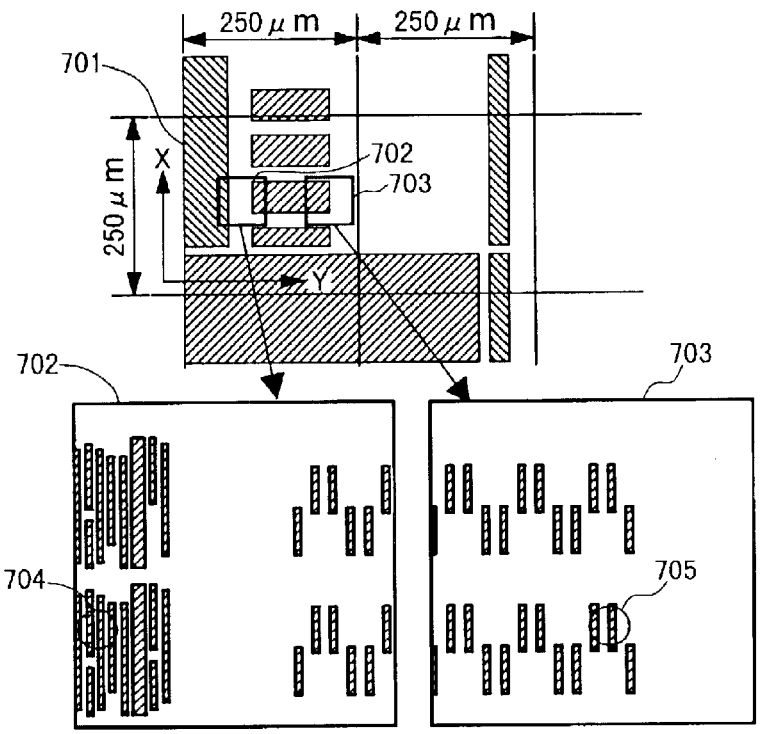
FIG.7C
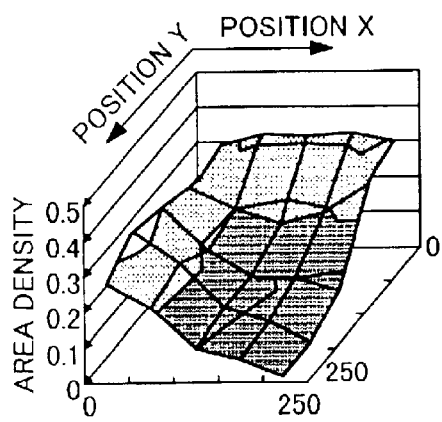
FIG.7D
| POSITION OF PATTERNS | 704 | 705 |
|---|---|---|
| PATTERN DIMENSION OF A MASK TO BE MODIFIED | −17.5nm | +40nm |
FIG.7E
| POSITION OF PATTERNS | | 704 | 705 |
|---|---|---|---|
| DIMENSION OF RESIST PATTERNS | CONDITION A | 70nm | 70nm |
| | CONDITION B | 75nm | 70nm |

FIG.9A

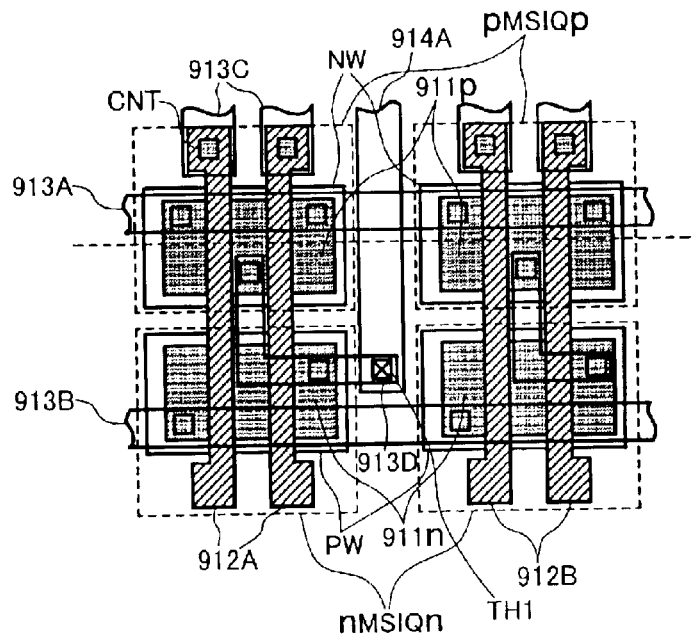

FIG.9B

| LSI FABRICATION PROCESS | NOTATION IN FIG.9A | APPLICATION OF EPL | | APPLICATION OF OPTICAL LITOGRAPHY |
|---|---|---|---|---|
| n-WELL FORMATION | NW | | | APPLY |
| p-WELL FORMATION | PW | | | APPLY |
| ISOLATION | 911n 911p | CM | MAP1 MAP2 MAP3 | |
| GATE ELECTROD | 912A 912B | CM | MAP1 MAP2 MAP3 MAP4 | |
| CONTACT HOLE | CNT | | MAP1 MAP2 | |
| METAL WIRING | 913A 913B 913C 913D | CM | MAP1 MAP2 MAP3 | |
| THROUGH HOLE 1 | TH1 | | MAP1 MAP2 | |
| METAL WIRING 2 ~PROTECTION | NOT IN A FIGURE | | | APPLY |

CM:
APPLICATION OF TWO COMPLEMENTARY MASKS

MAP1:
AREA DENSITY MAP OF BACKSCATTERING

MAP2:
AREA DENSITY MAP OF COULOMB EFFECT

MAP3:
AREA DENSITY MAP OF LOCAL COULOMB EFFECT

MAP4:
AREA DENSITY MAP OF PROCESS EFFECT

METHOD FOR FABRICATION OF PATTERNS AND SEMICONDUCTOR DEVICES

BACKGROUND OF THE INVENTION

1. Field of the Invention

The invention relates to a method of forming fine patterns, employing a mask for projection and an electron beam, and a method for fabricating a semiconductor device, using the same.

2. Description of the Related Art

With a method of forming patterns, employing an electron beam, the electron beam with which a substrate with a resist film formed on the surface thereof is irradiated scatters inside the substrate, and returns towards the resist film on which the patterns are to be fabricated across a wide range of the resist film, thereby causing a phenomenon wherein the deposition energy of the electron beam is nonuniformly distributed depending on dimensions and disposition of patterns in the vicinity thereof. As a result, deviation from design dimensions occurs to dimensions of a finished resist. This is called a proximity effect. A range affected by the proximity effect varies depending on an acceleration voltage of an electron beam, and electrons emitted at an acceleration voltage of, for example, 100 kV affect across a range within the substrate, not less than 30 µm in radius from a point of radiation, causing a change in the dimensions of patterns. Accordingly, there is the need for properly correcting the proximity effect in order to implement exposure with high precision Further, there has been a problem of low throughput with electron beam lithography because it is a method whereby small patterns are exposed in sequence, however, advance has been made recently in commercial application of a method with a throughput largely improved by use of a large area mask for projection. This method is generally called electron projection lithography (referred to hereinafter as EPL). With the EPL, a range subjected to exposure at one time is called a sub-field, and the sub-field has an area about 250 µm square. In the case of the above-described example, the range affected by the proximity effect is a range in the order of not less than 30 µm in radius, so that the proximity effect within the sub-field nonuniformly appears depending on the disposition of patterns. Consequently, it is not possible to employ a method for obtaining optimum dimensions of the patterns by varying intensity of exposure for every pattern to be exposed, which has been commonly practiced in the case of the conventional electron beam direct lithography without use of a mask for projection.

One method for correcting the proximity effect with EPL method is an auxiliary exposure method. This method is a method whereby nonuniformity in distribution of the deposition energy of an electron beam due to backscattering thereof, caused by nonuniformity of exposure patterns, is rendered uniform by virtue of auxiliary exposure. Since the effect of the backscattering is decreased in a sparse pattern region of the exposure patterns, auxiliary exposure is applied to the sparse pattern region. More specifically, this is attained by exposing patterns with tone reversed from that of the exposure patterns with an adequate intensity of exposure such that an extent of an electron beam blur is approximate to a range of backscattering. The largest advantage of the method is that complex calculation for the proximity effect is not required. However, since it becomes necessary to execute the auxiliary exposure in addition to exposure with exposure patterns, originally intended for, there have arisen problems with this method in that a mask for the auxiliary exposure is required, and throughput is in effect decreased due to exposure to be executed twice. Furthermore, because the auxiliary exposure results in subjecting regions other than regions of the exposure patterns to exposure, there has arisen another problem as well of inviting a drop in contrast of the deposition energy between patterned parts and unpatterned parts.

As a different EPL method of correcting the proximity effect, there is available a method of pattern modification. This is a method for causing mask patterns to be modified beforehand in anticipation of the patterns undergoing deformation after exposure due to the proximity effect. With this method, dimensions of mask pattern modification are set such that the finished dimensions of the mask patterns correspond to a design dimensions as a result of original dimensions thereof undergoing a change after exposure due to the proximity effect. The method is advantageous in that once an adequate mask is formed, exposure can be executed without taking into consideration the proximity effect at the time exposure. Further, since there is no need for executing exposure twice, there occurs no problem of a decrease in throughput. On the other hand, there has been a drawback with the method in that calculation of the dimensions of the mask pattern modification involves complex operation, requiring processing with a computer for many hours. Accordingly, as disclosed in, for example, Journal of Vacuum Science and Technology, Vol. B9 pp. 3048–3053, No. 6, November/December, 1991, there has been adopted a correction method based on the so-called rule-base wherein patterns having the same characteristic are grouped together to thereby decide upon modifying pattern dimension. Further, there has been disclosed a method for correction of the proximity effect through correction of intensity of exposure by use of a pattern area density map in JP-A No. 225816/1991. Similarly, a method of deciding upon dimensions of pattern modification by use of a pattern area density map in Japanese Journal of Applied Physics Vol. 37, pp. 6767–6773, No. 12B, December, 1998.

However, the conventional methods as described above have the following drawbacks. Firstly, with the method of subjecting a large area en bloc to exposure, a multitude of electrons reside in an electronic optical system, thereby causing a problem of a change occurring to an extent of electron beam blur by the agency of space charge. This is generally called a Coulomb effect. Total electric current varies on the basis of a unit of the previously described sub-field by each of the exposure patterns, so that the extent of the electron beam blur varies by a unit of the sub-field due to the Coulomb effect. Furthermore, the Coulomb effect is not necessarily constant even within the sub-field, so that the electron beam blur undergoes local changes depending on pattern sparseness or pattern denseness (this is referred to herein as local Coulomb effect). With the conventional methods, there has not been executed any correction for the proximity effect, taking into consideration as much as the local Coulomb effect.

Secondly, for effecting correction for the proximity effect, there is the need for establishing dimensions of pattern modification by taking into consideration the extent of the electron beam blur, dependent on aberration of an optical system and the Coulomb effect, and backscattering, however, since modification of the patterns causes other patterns to be affected, it is therefore necessary to establish dimensions of pattern modification, mutually uncontradictory to all the patterns, generally as the solution of simultaneous equations. This has raised a problem in that a great deal of time is required for calculation in the case of a complex LSI pattern of today.

Further, instead of finding the solution of the simultaneous equations, there are conceivable means for causing mutual effects on the patterns, accompanying modification of the patterns, to be converged by repeated computation. In such a case, the dimensions of pattern modification are expressed by the function of the pattern area density and the extent of the electron beam blur, and can therefore be found by solving linear equations. However, since it is necessary to repeat modification of the patterns and calculation of pattern areas for establishing the dimensions of pattern modification as the solution of the linear equations, it is still unavoidable to take a great deal of time for calculation.

Thirdly, with computation for complementary division, sub-field division, and correction for the proximity effect, there is the need for executing complex pattern computations with respect to massive LSI data. Normally, layout data of an LSI are processed as hierarchical data, thereby compressing an amount of the data to one several tenths thereof or less. With the conventional method, however, those processing are executed with respect to flat-structure data for every sub-field, so that it is not possible to make use of advantageous effects of the hierarchical data, thus causing a major problem in terms of process time and data handling.

SUMMARY OF THE INVENTION

It is therefore an object of the invention to provide a method of forming patterns, utilizing an EPL-type electron beam exposure method including a proximity effect correction method capable of coping with any of forward scattering, backward scattering, including electron beam blur, and a Coulomb effect, and a method of fabricating a semiconductor device, using the method of forming patterns.

It is another object of the invention to provide a method of forming patterns, utilizing an EPL-type electron beam exposure method, based on processing enabling fast and accurate correction for the proximity effect with reference to complex LSI patterns.

It is still another object of the invention to provide a method of fabricating a semiconductor device at a low cost by utilizing an EPL-type electron beam exposure method capable of fast processing of data and handling of compressed data.

The invention as disclosed in the present specification is typically summed up hereinafter.

Exposure patterns are divided into subdivided regions taking into consideration a scope of an effect of backscattering, the Coulomb effect, and process factors, respectively, on errors in dimensions, and a pattern area occupancy ratio (pattern area density) within the respective subdivided regions is retained. Then, dimensions of pattern modification, necessary for correction of dimensions, are found as the function of an extent of electron beam blur, dependent on a deflection position and current density of an electron beam, and respective pattern area densities, and are thereby established depending on dimensions and properties of the patterns, executing exposure so as to substantially coincide with the pre-estimated deflection position and current density of the electron beam at the time of electron beam exposure. Herein, pattern area densities of the subdivided regions for the sub-field in whole, or the exposure patterns in whole, retained as two-dimensional array data, is called a pattern area density map. Besides the above, in case that local pattern dependency on sparseness and denseness occurs in the process of developing a resist or in a later step of etching, subdivided regions corresponding to a range of such effect are set and dimensions of pattern modification are established as the function of a pattern area density of the subdivided regions. It is desirable that a pattern area density of a plurality of the subdivided regions of various sizes is calculated on the basis of a fundamental subdivided region when calculating an area from the pattern data by setting beforehand the fundamental subdivided region (the smallest subdivided region is desirable), and that a pattern area density of the subdivided regions of other sizes is calculated from a pattern area density of the fundamental subdivided region, already established. This is because a pattern area density map within a larger size subdivided region can be created from a pattern area density map having the smallest subdivided region with simple operation by the four rules of arithmetic, so that calculation can be made by far faster than calculation of an area directly from the pattern data.

As for the proximity effect, Coulomb effect, or process effects such as an etching effect, there are various cases where these effects are caused by patterns only in a specific subdivided region or by patterns in other subdivided region as the function of a distance. For example, the Coulomb effect is exerted by patterns only within a sub-field, however, the proximity effect is exerted by not only patterns within a specific subdivided region but also those within surrounding subdivided regions as the function of a distance, thereby being affected by those in a different sub-field. These distance-dependent effects can be collected by performing folding integration of a pattern area density found in the fundamental subdivided region with, for example, the distribution function of deposition energy in the case of the proximity effect or by performing similar processing.

With the EPL-type electron beam exposure method, exposure of desired patterns can be executed in the same region on a wafer by overlapping the electron beam passing through plural masks for several reasons. One of the reasons is that in the case of using a stencil mask having an opening in desired shape, allowing the electron beam passing therethrough, as a mask for projection, there exist a doughnut-shaped pattern that can not be implemented with a single mask and a pattern that needs to be divided into two because of weak mechanical strength. The other reason is that with pattern data having a very high pattern density, there is a case where desired resolution cannot be obtained because of a very strong Coulomb effect, resulting in the necessity of exposure with two divided masks. These two (or more if necessary) masks are called complementary masks. Upon exposure with the complementary masks, the Coulomb effect will be affected by exposure with the individual masks, but the proximity effect will be affected by patterns of the complementary masks in whole. In this case, a pattern area density map for the respective complementary masks, and a composite pattern area density map prepared therefrom are created, and modification of the patterns is executed, thereby enabling highly accurate patterns to be obtained.

Further, variation in pattern area density within the respective subdivided regions, accompanying modification of the patterns, is recalculated within the fundamental subdivided region, which is repeated until an amount of variation in pattern area density becomes less than a predetermined value. At this time, by retaining a perimeter of respective patterns within a subdivided region where area calculation is performed, an amount of variation in pattern area can be calculated from dimensions of pattern modification (a shift amount of respective sides) and the perimeter.

Time-consuming calculation is required to calculate areas from patterns after modification and to find an amount of variation thereof, however, calculation of an amount of variation in area from the perimeters can be implemented only by numerical calculation, so that considerable speed-up in repeated computation can be realized.

With respect to layout data designed so as to have a hierarchical structure, complementary division or complementary division and correction for the proximity effect are executed while maintaining the hierarchical structure as designed as much as possible. Hence, sub-field division is preferably executed after execution of the complementary division.

BRIEF DESCRIPTION OF THE DRAWINGS

FIG. 3 shows views illustrating the second embodiment of the invention, particularly to describe a procedure for implementing modification of pattern dimensions with the use of the pattern area density map as created, FIG. 3A being a view showing respective subdivided region sizes and notations of positions against the pattern area density map to find a sub-field, local Coulomb effect, and backscattering, FIG. 3B a view showing sub-field current, local Coulomb effect, and pattern area density, at respective positions, together with an extent of electron beam blur, and backscattering energy, corresponding to the former, respectively, and FIG. 3C a view showing dimensions of pattern modification for a line pattern and a contact hole;

FIG. 7 shows views of a fifth embodiment of a method of forming patterns according to the invention, describing an example of applying the invention to the step of fabricating a first wiring layer of an LSI, FIG. 7A being a schematic plane view of a sub-field after a LSI pattern is divided into sub-fields, FIG. 7B a schematic plane view showing specific wiring patterns, FIG. 7C a view showing pattern area density distribution within the sub-field as expressed by a three-dimensional graph, FIG. 7D a view showing dimensions of mask pattern modification, corresponding to pattern positions, and FIG. 7E a view showing dimensions of resist patterns;

FIG. 9 shows views of a seventh embodiment of a method of fabricating an LSI according to the invention, using the method of forming patterns according to the invention, FIG. 9A being a schematic plane view of an LSI pattern, and FIG. 9B a table for describing selective application of EPL of the invention, using a stencil mask, and photolithography, during steps of fabricating various patterns;

DETAILED DESCRIPTION OF THE PREFERRED EMBODIMENTS

Embodiment 1

Figure 1:
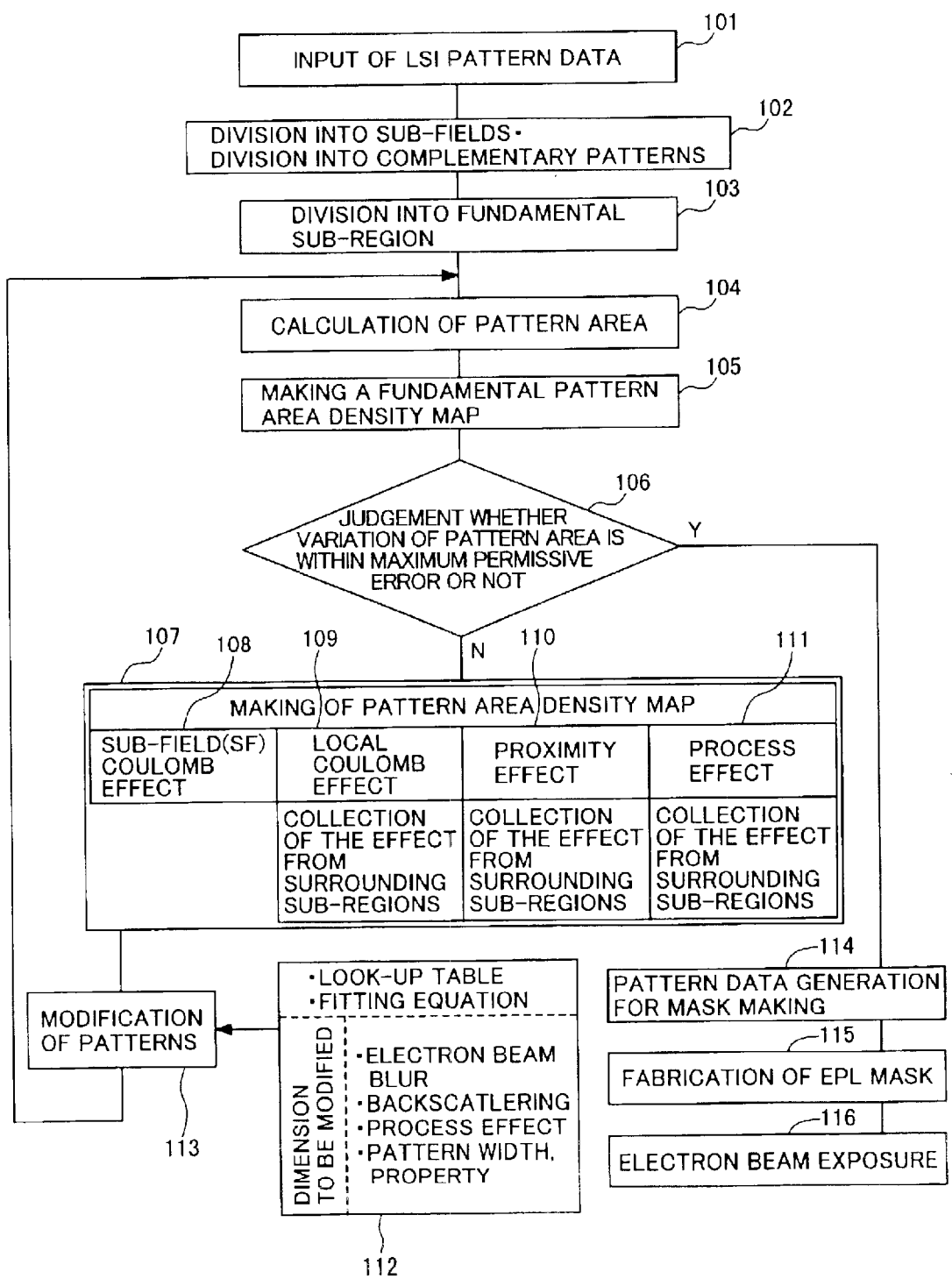
FIG. 1 is a flow chart illustrating a first embodiment of a method of forming patterns according to the invention.

Preferred embodiments of the invention are described hereinafter with reference to FIG. 1. FIG. 1 is a flow chart illustrating a method of forming patterns. Sections in rectangular shape are function blocks for data processing. First, LSI pattern data are provided as an input (101). Subsequently, as indicated by reference numeral 102, the pattern data is divided into units of sub-field (a region of a maximum size that can be subjected to projection by an electron beam at one time, equivalent to about 250 $\mu$m square on top of a wafer) that is dependent on an electron beam lithography system. Also, depending on LSI layers, division of the data into complementary patterns is executed as necessary. The order in which division of the pattern data into the sub-fields, and division of the pattern data into the complementary patterns are executed may be reversed. Thereafter, division of the pattern data into fundamental subdivided regions to serve as units for calculation of a pattern area density is executed (103), and individual pattern areas in the respective subdivided regions are calculated and summed up (104). A ratio of the sum total of the pattern areas to an area of the respective subdivided regions is called herein as a pattern area density. In the case of processing on the basis of LSI patterns in whole or the sub-field, a pattern area density of the respective fundamental subdivided regions is calculated for the sub-field in whole, and the pattern area densities are rendered into two-dimensional array data, which is called a fundamental pattern area density map to be retained (105). The size of the respective fundamental subdivided regions is preferably in the order of 1 to 10 $\mu$m, and needs to be smaller than that for subdivided regions of several pattern area density maps to be used later for pattern modification. Further, the smallest subdivided region among subdivided regions for use in correction for a local Coulomb effect, proximity effect, and process factors, described later, can be substituted for the respective fundamental subdivided regions.

In the case where the fundamental pattern area density map is created for the first time, processing for determination as indicated by reference numeral 106 unconditionally proceeds to processing towards N. Subsequently, there are created several pattern area density maps having subdivided regions of size that differs by each of several factors causing degradation in dimensions of patterns (107). With the present embodiment, there are four varieties of the pattern area density maps, concerned with the Coulomb effect of sub-fields (SF) in whole (108) local Coulomb effect (109), proximity effect (110), and process effects such as etching etc. (111), respectively. The size of the respective subdivided regions is set to be 250 μm square for the pattern area density map 108, 20 μm square for the pattern area density map 109, 10 μm square for the pattern area density map 110, and 30 μm square for the pattern area density map 111. A pattern area density of the respective subdivided regions of the four pattern area density maps can be calculated by simple processing for the arithmetic means of elements of the fundamental pattern area density map previously described, thus enabling high-speed processing. As for the Coulomb effect of the sub-fields (SF) of 108, because Coulomb effect is established depending on only a pattern area ratio inside the individual sub-fields and current density of the electron beam, the pattern area density map as calculated from the fundamental pattern area density map is retained as it is. Meanwhile, the other three varieties of factors have a distance-dependent effect on dimensions of patterns of interest, respectively, even if those patterns involve not only patterns in the subdivided regions of interest but also patterns in surrounding subdivided regions. Accordingly, the results of calculating collection of the effect from the surrounding subdivided-regions by use of a distribution function expressing a degree of the respective effects are retained as the respective pattern area density maps. Since dimensions of pattern modification, required for correction of dimensions, are largely dependent on an extent of electron beam blur as well, the extent of the electron beam blur is decided upon by taking into consideration aberration at spots of sub-field deflection, established depending on an electron beam optical system, and the Coulomb effect. With the use of a look-up table or an approximate equation (112), correlating respective elements of the plural pattern area density maps described above with the dimensions of pattern modification, modification of individual patterns is executed (113).

As a result of executing pattern modification according to processing described as above, a pattern area density of the respective subdivided regions undergoes a change, thereby causing occurrence of an error with respect to the dimensions of pattern modification. For correction of the error, on the basis of patterns formed after modification, pattern areas in the respective fundamental subdivided regions are calculated again (104), thereby creating again a pattern area density map (105). Subsequently, whether or not a difference (variation) between respective elements of the latest pattern area density map, and those of a pattern area density map created immediately before the former is within the maximum permissible error or not is determined (106), and in the negative case, the processing described as above is repeated. In the affirmative case, the processing for pattern modification is completed, whereupon processing proceeds to a next step of generating pattern data for mask making (114). During this step, there is executed pattern processing such as scale-up of the pattern data, matching a reduction factor (¼) of the electron beam optical system, mirroring, and so froth, followed by processing for data conversion so as to match a data format of a mask drawing apparatus. Subsequently, after mask drawing by use of the mask drawing apparatus, and development of a resist, an EPL mask is fabricated (115) through mask processing such as etching of a substrate, and so forth. In the step of executing electron beam exposure with the use of the EPL mask (116), processing is executed such that spots of sub-field deflection and current density of the electron beam substantially coincide with the spots of sub-field deflection and the current density of the electron beam that have been assumed at the time of executing the pattern modification, thereby forming patterns as desired.

Embodiment 2

Figure 2:
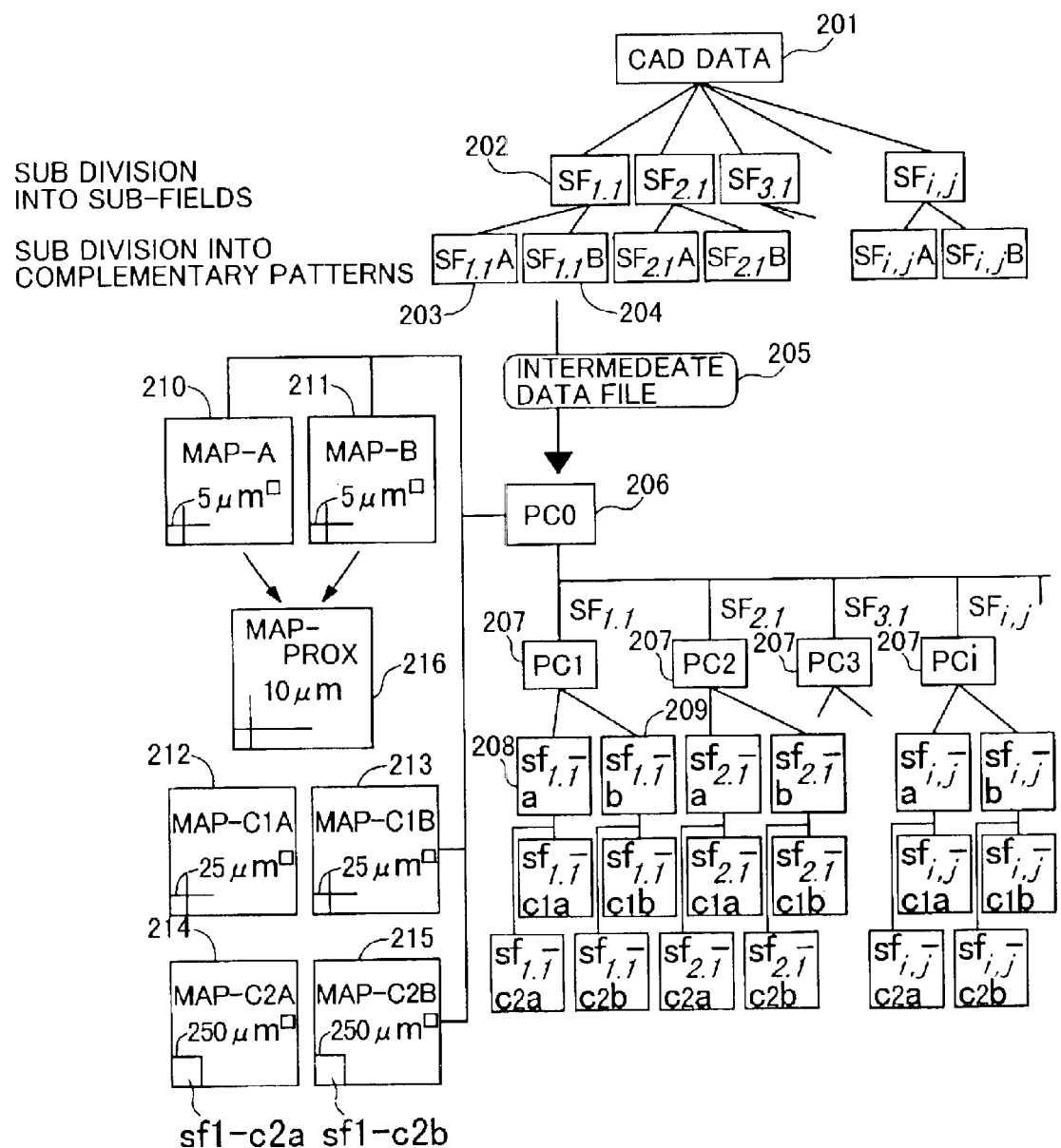
FIG. 2 is a view illustrating a second embodiment of a method of forming patterns according to the invention, particularly to describe a method of finding a pattern area density map by dividing pattern data into plural complementary patterns.

FIGS. 2 and 3 are views illustrating processing in detail in the case of dividing pattern data into complementary patterns. FIG. 2 is a view illustrating a method of finding a pattern area density map. CAD data 201 completed by a layout design for an LSI of chip size 20 mm square is first divided into those in sub-fields 202, 250 μm square. The data after division comprises 6400 sets of data, in $SF_{1,1}$ to $SF_{80,80}$. Subsequently, each of the sub-field data is divided into two complementary data, 203, 204, that is, divided into $SF_{1,1}$ A and $SF_{1,1}$ B, in the case of, for example, $SF_{1,1}$. Such division is implemented such that each of the complementary data does not include a doughnut-shaped pattern therein, and a pattern has a size with a ratio of the longitudinal dimension thereof to a transverse dimension thereof (aspect ratio) not exceeding 30. Processing up to this point is outputted as a function block to an intermediate data file 205. The format of the intermediate data file is preferably one having conformability with function blocks for use in processing to be executed henceforth. If the format is the stream format for use in sending and receiving of LSI data, it has high versatility even in the case of processing using different software. However, in executing the processing described above, and the processing to be executed henceforth in succession, it is desirable to retain the intermediate data file in a relevant software's own data format from the viewpoint of enhancement in processing speed.

Thereafter, the data divided into sub-fields and the data subdivided into complementary data as a result of the processing previously described are sequentially inputted to a computer PC0 (206) in order to execute processing for correction of the proximity effect etc. (processing for correction of an error in dimensions, due to the Coulomb effect, proximity effect, and process factors is herein referred to simply as processing for correction of the proximity effect etc.). The computer PC0 is connected to ten units of computers from PC1 to PC10 (207), and the data inputted to the computer PC0 is distributed to the individual computers in units of a sub-field. The individual computers divide the data subdivided into the complementary data by the sub-field into fundamental subdivided regions, 5 μm square, and calculate a pattern area density in the respective fundamental subdivided regions, thereby creating pattern area density maps, for example, $sf_{1,1}$-a, $sf_{1,1}$-b (208, 209). Subsequently, subdivided regions C1 25 μm square are set in order to execute correction for the local Coulomb effect. Assuming that influence of the local Coulomb effect, on a point away at a distance n, is a function $f_1$ (x), elements $sf_{i,j}\_c1a$ (K, L), $sf_{i,j}\_c1b$ (K, L) of a pattern area density map for correction of the local Coulomb effect, centering on C1, are found by expression (1):

$$sf_{i,j}\_c1a(K, L) = \sum_k \sum_l sf_{i,j}\_a(k, l) * f_1(x) \quad (1)$$

$$sf_{i,j}\_c1b(K, L) = \sum_k \sum_l sf_{i,j}\_b(k, l) * f_1(x)$$

Similarly, the Coulomb effect for the sub-fields in whole is found by expression (2) because it is sufficient to calculate a pattern area density of subdivided regions each 250 μm square in size. In this case, n represents the number of fundamental subdivided regions in the x-axis direction and y-axis direction, respectively, in the respective sub-fields. Since the individual computers handle one unit of sub-field, $sf_{i,j}$-c2a, $sf_{i,j}$-c2b have only one value, respectively.

$$sf_{i,j\_}c2a = (1/n^2) * \sum_{k=1}^{n}\sum_{l=1}^{n} sf_{i,j\_}a(k, l) \quad (2)$$

$$sf_{i,j\_}c2b = (1/n^2) * \sum_{k=1}^{n}\sum_{l=1}^{n} sf_{i,j\_}b(k, l)$$

These data are returned to the computer PC0 (206), thereby creating fundamental pattern area density maps of a whole LSI chip, MAP-A, MAP-B (210, 211). Similarly, there are created pattern area density maps for correction of the local Coulomb effect, MAP-C1A, MAP-C1B (212, 213), and pattern area density maps for correction of the Coulomb effect in the respective sub-fields, MAP-C2A, MAP-C2B (214, 215).

Meanwhile, the effect of backscattering extends beyond the respective sub-fields, and accordingly, needs to be taken into consideration on the basis of the whole LSI chip. For this reason, a pattern area density map for correction of backscattering MAP-PROX (216), comprising subdivided regions each 10 μm square, is created from the fundamental pattern area density maps, MAP-A, MAP-B (210, 211). As for elements in the respective subdivided regions of MAP-PROX, respective elements of the fundamental pattern area density maps, MAP-A, MAP-B, respectively, on the same position on the LSI chip as those in the respective subdivided regions of MAP-PROX is added according to expression (3):

$$MAP\_total(K,L) = MAP\_A(K,L) + MAP\_B(K,L) \quad (3)$$

Subsequently, effects of surrounding subdivided regions are collected. Assuming that a distribution function of backscattering is $f_2(x)$, elements of a pattern area density map for correction of backscattering are found by expression (4):

$$MAP\_PROX(K, L) = \sum_{i}\sum_{j} MAP\_total(i, j) * f_2(x) \quad (4)$$

where $f_2(x)$ is can be well approximated by Gaussian distribution, and is normally expressed by expression (5)

$$f_2(x) = (1/\pi\beta_b^2) * exp(-x^2/\beta_b^2) \quad (5)$$

where $\beta_b$ is a distance at which an amount of deposition energy of backscattering by an electron beam incident on a point becomes 1/e of that at the point of incidence, and is called a backscattering coefficient.

Now, referring to FIG. 3, there is described a procedure for implementing modification of pattern dimensions with the use of the pattern area density maps as created. In this case, assuming that errors in dimensions, due to process effects, are negligible, correction for a sub-field Coulomb effect, local Coulomb effect, and proximity effect due to backscattering, respectively, is executed. Accordingly, as shown in FIG. 3A, use is made of three varieties of the pattern area density maps. Further, explanation is given herein on only one of complementary patterns, however, similar processing is applicable to the other. Array in the respective pattern area density maps is denoted (i, j) for the map for the sub-field Coulomb effect, (k, l) for the map for the local Coulomb effect and (m, n) for the map for backscattering, respectively. Electron beam blur (including forward scattering in a resist) and backward scattering cause occurrence of movement in dimensions, due to the proximity effect. Accordingly, with the present embodiment, there is the need for finding an extent of electron beam blur and an amount of deposition energy of backscattering on the basis of every unit of the pattern area density map for backscattering, with subdivided regions smallest in size. The causes for the electron beam blur include aberration dependent on the electron beam optical system and the Coulomb effect on the basis of a unit of sub-field. The aberration of the electronic optical system depends on the coordinates (x, y) from the center of sub-field deflection. Further, assuming that current density of the electron beam is $i_b$, electric current on the basis of a unit of sub-field can be calculated by a formula, $i_b * sf_{i,j}$-c2a, using area density of the relevant sub-field, $sf_{i,j}$-c2a. The extent of the electron beam blur at this point in time is assumed to be $\beta_{f1}$ as shown in FIG. 3B. Further, the local Coulomb effect in the sub-field (i, j) is given as a value $\beta_{f2}$ dependent on $i_b * sf_{i,j\_}$c1a (k, l) from area density inside a 50 μm square, $sf_{i,j\_}$c1a (k, l) and the current density of the electron beam, $i_b$. It is to be pointed out in this connection that the pattern area density, $sf_{i,j\_}$c1a (k, l) is not the pattern area density established simply on the basis of the sub-region (k, l) only, but the pattern area density collecting also the effects of the surrounding subdivided regions. Further, the extents of the electron beam blur $\beta_{f1}$, $\beta_{f2}$ are intrinsic values dependent on respective electric currents and the optical system. An extent of the electron beam blur in total within one sub-region for correction of the local Coulomb effect is found by expression (6):

$$\beta_f = \sqrt{\beta_{f1}^2 + \beta_{f2}^2} \quad (6)$$

It is possible to correct the effect of electron beam blur by addition of process effects affecting a region in the order of not more than 1 μm to an extent of the electron beam blur. For example, since the effect of acid diffusion of a chemical amplified resist is a phenomenon independent from the electron beam blur, it is added to expression (6), which is deemed equivalent to an increase in the extent of the electron beam blur. The effect of backscattering is proportional to the product η* MAP-PROX i,j (m, n) of area density inside the sub-region (m, n), MAP-PROX i,j (m, n), and η expressing a degree of reflection of the electron beam from substrate material. To be more exact, assuming that energy deposited on a resist due to forward scattering of an electron beam incident at a point is 1, η is defined as a value of energy deposited on the resist due to backscattering of the electron beam from the substrate.

As for a line pattern and contact hole, shown in FIG. 3C, modifying patter dimensions are found as follows.

First, a pattern width w and a modifying pattern dimension thereof Δw are normalized with an extent $\beta_f$ of an electron beam blur for generalization, and further, for simplification of an expression, a pattern area density of the relevant sub-region of backscattering is represented simply by α. That is, if expression (7) is given as follows:

$$w = W/\beta_f$$

$$\Delta w = \Delta W/\beta_f$$

$$\alpha = MAP\_PROX_{i,j}(m, n) \quad (7)$$

The modifying pattern dimension Δw in the case of the line pattern and contact hole, respectively, is found by expression (8) given below:

$$erf(w+\Delta w/2) - erf(\Delta w/2) + \alpha^* \eta = Es$$

$$(\tfrac{1}{4})^* \{erf(w+\Delta w/2) + erf(\Delta w/2)\}^2 + \alpha^* \eta = Es$$

$$Es = (\tfrac{1}{2})^*(1+\eta) \tag{8}$$

where Es is fundamental energy, expressing deposition energy at pattern edges with such intensity of exposure as allowing 1:1 line/space pattern to be finished as designed.

With respect to patterns in respective subdivided-regions, a modifying pattern dimension is found, thereby executing pattern modification. An extent of an electron beam blur differs by a different subdivided-region of the local Coulomb effect, and a level of backscattering differs by a different subdivided-region of backscattering. Accordingly, patterns of identical dimensions are provided with an identical modifying pattern dimension only in an identical subdivided-region of backscattering.

As described with reference to Embodiment 1, variation of the pattern area density maps, accompanying modification of patterns, is converged by repeated calculation made hereinafter, thereby making a decision on a final modifying pattern dimension.

With the present embodiment, a calculation method for processing to collect the pattern area density from the surrounding subdivided-regions and that for variation of dimensions are described by way of example, however, it is to be pointed out that the calculation method is not limited to the expressions described in the foregoing provided that the calculation method is equivalent thereto. Further, although an example of parallel calculation employing plural computers is described, it is also possible to execute processing with only one unit of computer depending on an amount of data to be processed. Furthermore, the solution of an equation according to expression (8) is used to establish the variation of dimensions, however, it is also possible to find the variation of dimensions and a shift amount at edges of the line as required by referring to a correction table prepared so as to correspond to pattern widths and pattern area densities.

Embodiment 3

Figure 4:
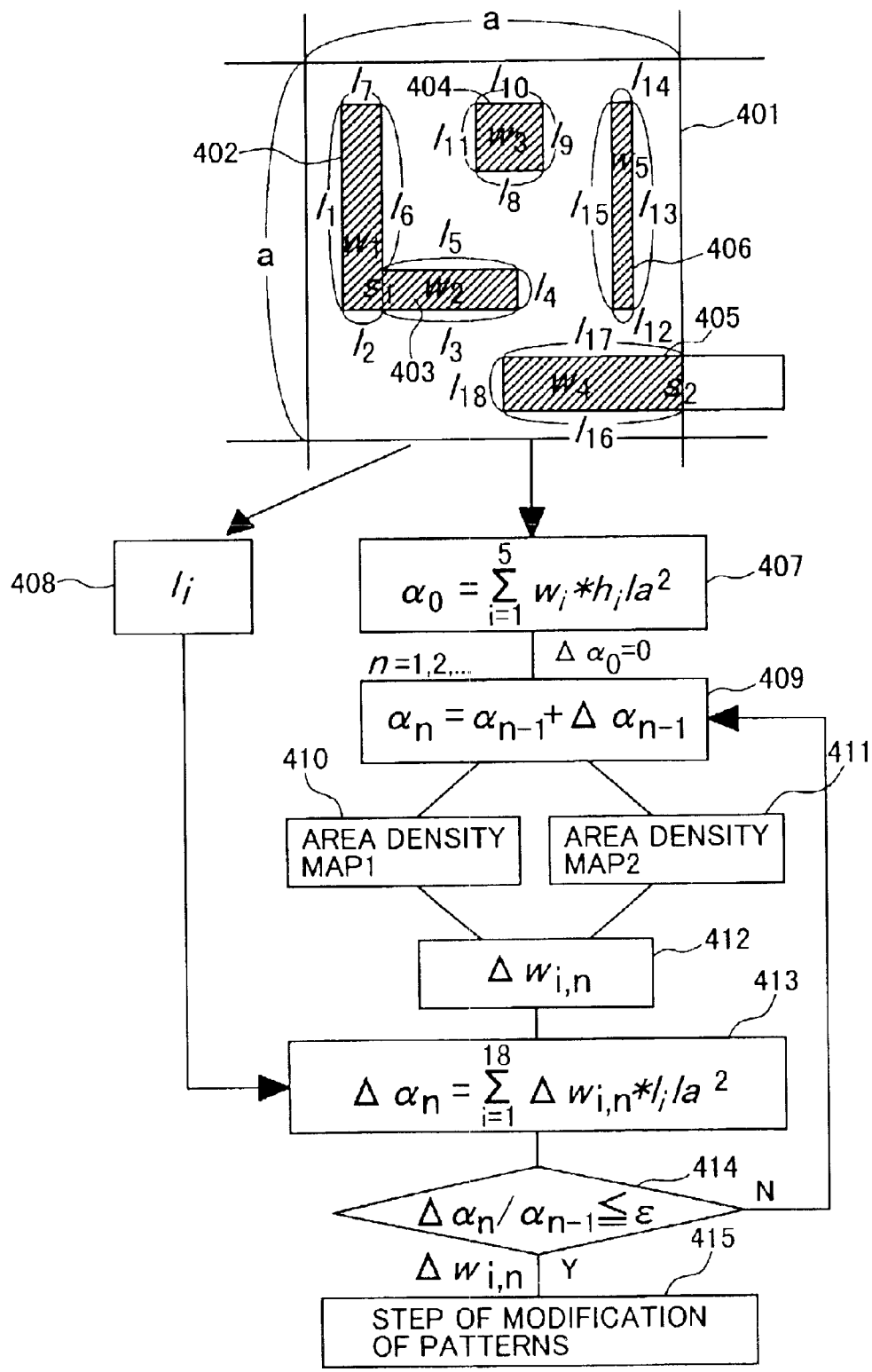
FIG. 4 is a flow chart of a third embodiment of a method of forming patterns according to the invention, describing a procedure for executing modification of specific patterns.

FIG. 4 is a flow chart showing a still another embodiment, illustrating a method whereby errors due to variation in pattern area density accompanying modification of patterns are reduced by means of convergence calculation, and convergence calculation is further executed at high speed. With the present embodiment, there is described only a step of modifying patterns inside a fundamental subdivided-region by use of a pattern area density map.

There exist five rectangular patterns, patterns 402 to 406, inside a fundamental subdivided region 401 of size a, shown in FIG. 4. A shorter side of the respective rectangular patterns is referred to as w1 to w5, respectively, and a longer side thereof as h1 to h5 (not shown), respectively. The pattern 402 shares a side s1 with the pattern 403, and the pattern 405 lies so as to extend into an adjacent fundamental subdivided region. A line along which the pattern 405 is intersected by a demarcation line of the fundamental subdivided region 401 is defined as a phantom side s2. A pattern area density $\alpha_o$ of the fundamental subdivided region, prior to execution of modification of patterns, is found by expression (9) given below, denoted by 407 in the figure.

$$\alpha_0 = \sum_{i=1}^{5} w_i * h_i / a^2 \tag{9}$$

In this case, in calculation of the pattern area density, the pattern 405 is assumed to be cut at the phantom side s2.

Further, a perimeter of each of the patterns is retained in 408. Herein, in calculation of the perimeters, the side s1 as shared and the phantom side s2 are to be excluded. Calculation of an initial value of the actual pattern area density $\alpha_o$, and the perimeter $l_i$ is executed by pattern operation. Subsequently, variation of the pattern area density accompanying modification of patterns is calculated by expression (10) denoted by 409.

$$\alpha_n = \alpha_{n-1} + \Delta\alpha_{n-1}$$

where $$\Delta\alpha_0 = 0 \tag{10}$$

However, variation of the pattern area density, found by a first calculation, is 0. Subsequently, as with the second embodiment, a pattern area density map 1 denoted by 410, for calculation of an extent of an electron beam blur, and a pattern area density map 2 denoted by 411, for calculation of backscattering, are created on the basis of a pattern area density map as calculated in the individual fundamental pattern area density maps. On the basis of these plural pattern area density maps, individual dimensions of pattern modification $\Delta w_{i,n}$ in the respective subdivided regions are found (412). Herein, variation of the pattern area density, accompanying modification of the patterns, can be found by expression (11) denoted by 413 in the figure.

$$\Delta\alpha_n = \sum_{i=1}^{18} \Delta w_i * l_i / a^2 \tag{11}$$

The expression (11) ignores slight variation in pattern area, taking place at the vertex of the patterns, following shifting of a side, and to be more exact, it is desirable to retain the number of vertices by every pattern in the respective fundamental subdivided regions to thereby add (in the case of causing an increase in width) $\Delta w_{i2/a2}$ * (the number of vertices) to, or subtract ((in the case of causing a decrease in width) the same from the expression (11). Since the dimensions of pattern modification are decided upon a pattern area density prior to execution of the modification of the patterns, an error occurs to the dimensions of pattern modification in the case where there is large variation in pattern area density, found by the expression (11). Accordingly, adequacy of the modification of the patterns as shown in FIG. 4 is determined by expression (12) (414).

$$\Delta\alpha_n / \alpha_{n-1} \leq \epsilon \tag{12}$$

If the variation in the pattern area density, obtained as a result, is greater than a preset maximum permissible error, that is, if the result of determination is found negative, there are executed re-calculation of the pattern area density (409), and creation of the pattern area density maps (410, 411), finding the dimensions of pattern modification (412) and the variation of the pattern area density (413), whereupon the determination denoted by 414 in the figure is executed again. Such operation is repeated, and at a stage where the variation in the pattern area density is found not greater than the maximum permissible error in the step 414 (if the result of determination is found affirmative), it is determined that the modifying pattern dimension corresponds to an appropriate value, proceeding to a step (415) of executing actual modification of the patterns.

Generally, variation in pattern area, following modification of patterns, needs to be established by calculating an area against a pattern after execution of the modification of patterns, thereby calculating a difference in pattern area between before and after the modification of patterns.

In such a case, there arises a problem of processing time becoming longer because there is the need for processing for shifting of sides of respective patterns, and in addition, for calculating resultant pattern area densities. With the present embodiment, it becomes possible to directly calculate variation in pattern area density, following modification of patterns, without processing for shifting of the sides of the original patterns. As a result, whether or not dimensions of pattern modification have been appropriate can be determined only by simple calculation of array values. Since modification of patterns only for actual shifting of the sides of the patterns needs to be executed against the dimensions of pattern modification found appropriate, the invention can provide considerable advantage in that time-consuming processing of patterns is required only once Embodiment 4

With the present embodiment, a method enabling faster processing for several calculations by use of approximate expression found by fitting is described with reference to FIGS. 5 and 6.

It is well known that an extent of electron beam blur is dependent on blur caused by aberration of an electron beam optical system and the Coulomb effect. The aberration of the electron beam optical system varies depending on a current value of an electron beam and deflection position thereof, so that an extent of electron beam blur of individual sub-fields varies depending on a deflected sub-field position, current density of the electron beam, and an aperture area of the individual sub-fields. It will take a great deal of time to find the extent of electron beam blur of the individual sub-fields through simulation.

Figure 5A:
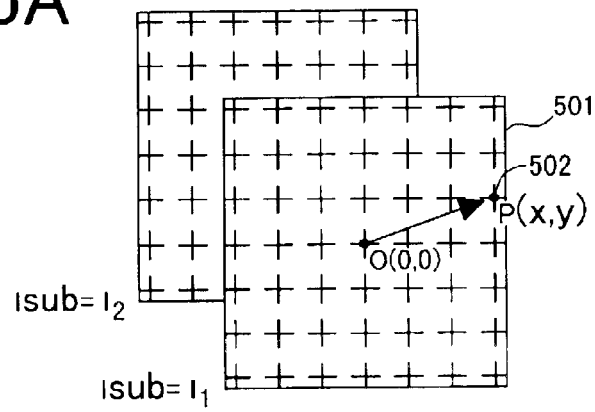
FIG. 5 shows views of a fourth embodiment of a method of forming patterns according to the invention, describing particularly a simple method of finding an extent of electron beam blur, FIG. 5A being a view showing a deflectable sub-field region, FIG. 5B a conceptual view showing a pattern area density map in connection with the Coulomb effect, FIG. 5C a graph showing electron beam blur due to sub-field Coulomb effect in relation to sub-field current value, FIG. 5D a conceptual view showing a pattern area density map in connection with local Coulomb effect within a sub-field, and FIG. 5E a graph showing electron beam blur due to local Coulomb effect in relation to a beam current value.
Figure 5B:
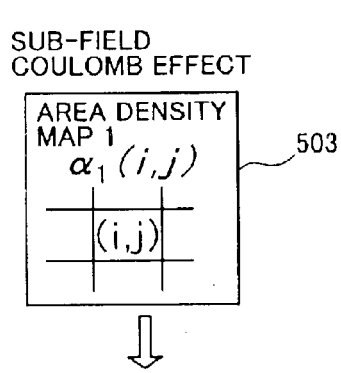

With the method according to the present embodiment, there are provided plural sampling points 502 in a deflectable sub-field region 501 as shown in FIG. 5A. Thereafter, an extent of electron beam blur at a sampling point P (x, y) when sub-field current is at $I_1$ is found by simulation. Such operation is applied to all the sampling points provided. Similarly, an extent of electron beam blur at the sampling point P (x, y) when the sub-field current is at $I_2$ is found by simulation. Correlation between the position (x, y) of the respective sampling points when the sub-field current is at $I_1$ and an extent $\beta_{fo-I1}$ of the electron beam blur is expressed by a fitting polynomial expression. Approximation by means of, for example, a quintic polynomial expression takes the form of expression (13):

$$\beta_{fo-I1}=b_0+b_1x+b_2y+b_3x^2+b_4xy+b_5y^2+b_6x^3+b_7x^2y+b_8xy^2+b_9y^3+b_{10}x^4$$
$$+b_{11}x^3y+b_{12}x^2y^2+b_{13}xy^3+b_{14}y^4+b_{15}x^5+b_{16}x^4y+b_{17}x^3y^2+b_{18}x^2y^3+b_{19}xy^4+b_{20}y^5 \quad (13)$$

Similarly, this is applied to the case of the sub-field current being at $I_2$ and thereby an approximate expression for $\beta_{fo-I2}$ is found. To find an extent of electron beam blur of a single sub-field {assumed to be at a position (i,j)}, $\beta_{fo-I1}$ or $\beta_{fo-I2}$ at the deflected position (x, y), that is, the expression (13) can be evaluated by replacing the variables with coordinates. A pattern area density of the single sub-field (i, j) is found from a pattern area density map 1 (503) shown in FIG. 5B, and assuming that the pattern area density is designated $\alpha_1(i, j)$, and current density of the electron beam $i_b$, sub-field current is $\alpha_1(i, j)*i_b$. If correlation between an extent of electron beam blur and sub-field current can be represented graphically by a straight line, then an extent of the electron beam blur in the single sub-field (i, j) can be found by means of expression (14):

$$\beta_{f1}=b_0+\alpha_1(i,j)*i_b*b_1 \quad (14)$$

Herein, for simplification, fitting of the expression (14) is implemented by a linear polynomial expression, however, by carrying out further simulations to find an extent of the electron beam blur on the basis of different current values, and by fitting the same by a high-order polynomial expression, approximation can be attained with high precision.

Figure 5D:
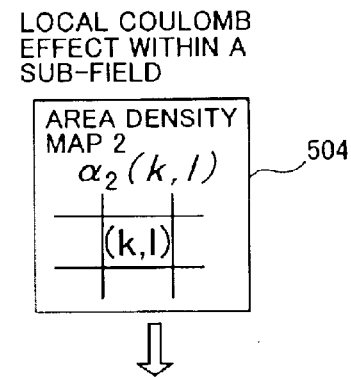
Figure 5C:
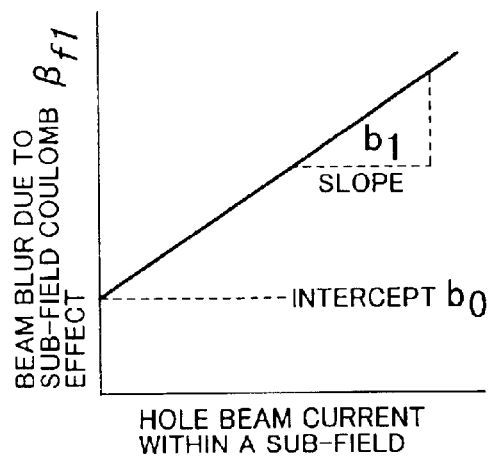
Figure 5E:
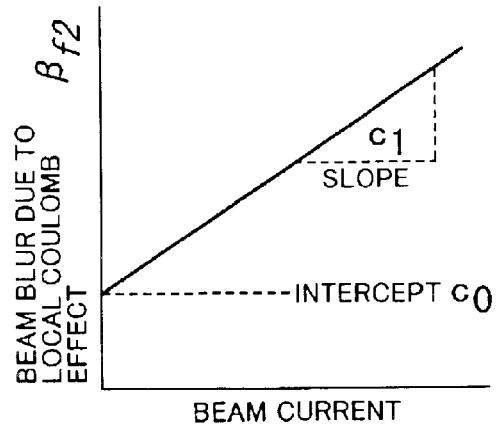

Similarly, local Coulomb effect having distribution within a sub-field can be found from a pattern area density $\alpha_2(k, l)$ of a pattern area density map 2 (504) shown in FIG. 5D by expression (15):

$$\Delta\beta_{f2}=c_0+\alpha_2(k,l)*i_b*c_1 \quad (15)$$

Herein, however, the extent of the electron beam blur is found as variation of the electron beam blur due to distribution within respective sub-fields. As a result, an extent $\beta_f$ of the electron beam blur, obtained by taking into consideration the aberration of the electronic optical system, sub-field Coulomb effect and local Coulomb effect within the respective sub-fields altogether, can be found by expression (16):

$$\beta_f=\beta_{f1}+\Delta\beta_{f2} \quad (16)$$

With the use of a pattern width w and a modifying pattern dimension $\Delta w$, normalized by $\beta_f$ of the expression (16), the expression (8) is turned into expression (17):

$$erf(w+\Delta w/2)-erf(\Delta w/2)+\alpha*\eta=(\frac{1}{2})*(1+\eta) \quad (17)$$

Figure 6A:
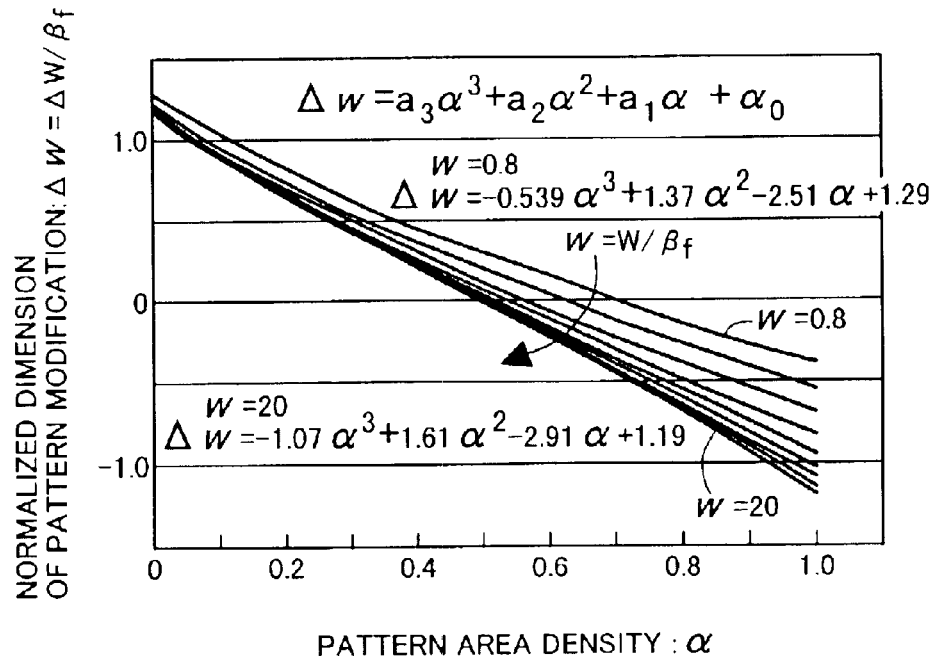
FIG. 6 shows views of the fourth embodiment of the invention, describing particularly a simple method of finding dimensions of pattern modification, FIG. 6A being a graph showing normalized dimensions of pattern modification in relation to pattern area density, and FIG. 6B a graph showing factors of fitting polynomial expression in relation to normalized pattern width.

It is not difficult to find $\Delta w$ from the expression (17), however, execution of operation on individual patterns of a LSI requires a great deal of time. Accordingly, with the present embodiment, there is executed approximation of the solution of the expression (17) by a polynomial expression. Since reflection coefficient $\eta$ of the electron beam reflected from a substrate due to backscattering is basically constant provided that a substrate material is the same, it can be regarded that $\eta=0.6$, assuming a case where electron beam exposure is applied to a silicon substrate at an accelerated voltage of 100 kV. FIG. 6A is a graph showing the results of solving the expression (17) against $\Delta w$ with the normalized pattern width w as a parameter. Correlation between a pattern area density $\alpha$ and a modifying pattern dimension $\Delta w$ can be very well fitted by a cubic polynomial expression {expression (18)}:

$$\Delta w=a_3a^3+a_2a^2+a_1a+a_0 \quad (18)$$

Figure 6B:
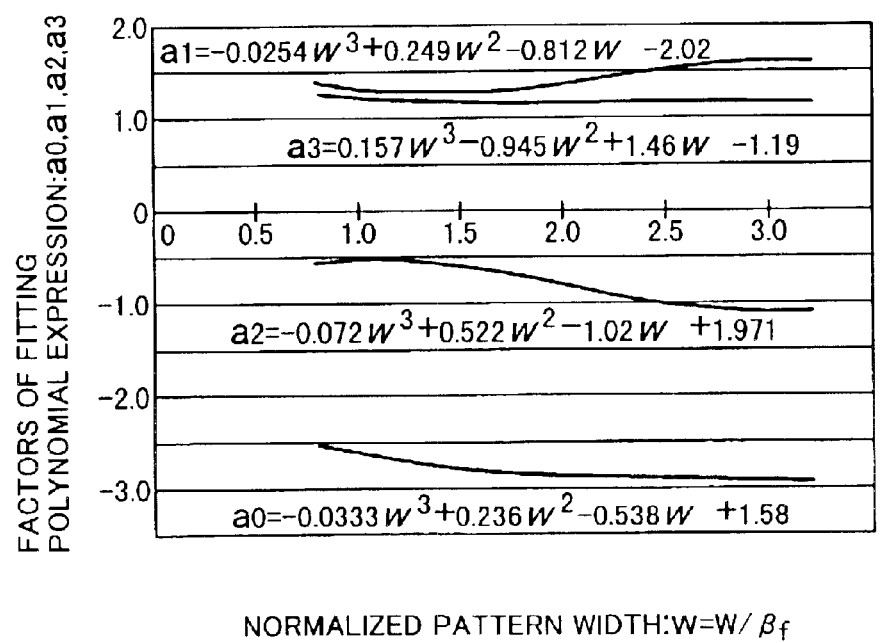

Further, it becomes evident that $\Delta w$ becomes independent on a pattern width according as the normalized pattern width increases, and is thereby converged to an approximate curve. FIG. 6B is a graph showing correlation between factors a3, a2, a1, a0 of terms of the cubic polynomial expression {expression (18)}, respectively, and the normalized pattern width w. The results of FIG. 6B show that the respective factors can also be expressed by a cubic polynomial expression in a range of about 0.8<w<about 3.2. In a range of 3.2<w, the respective factors are substantially constant. That is, it can be said that these are not dependent on the pattern width.

With the use of the results of FIGS. 6A, 6B, there is no need for solving the expressions for every single pattern, and variation in pattern shape can be found simply by replacing the variables of the cubic polynomial expression with number, thereby enabling considerable speed-up in processing. With the present embodiment, description is given on line patterns, however, with reference to hole patterns and rectangular patterns as well, similar speed-up is enabled through approximation by a polynomial expression. Further, as described hereinbefore, the extent of the electron beam blur, obtained by taking into consideration the aberration of the electronic optical system, sub-field Coulomb effect and local Coulomb effect within the respective sub-fields altogether, is found in the form of the sum by the expression (16), however, the same can be found in the form of the sum of squares by a method of calculating contributions thereto by electron beam blurs due to the local Coulomb effect.

Embodiment 5

An example of applying the invention to exposure for patterns of a logic LSI is described with reference to FIG. 7. FIG. 7 illustrates an example of applying the invention to the step of fabricating a first wiring layer of the LSI. FIG. 7A shows a portion of a LSI pattern after divided into sub-fields, and a region 701 is one of the sub-field regions, divided into 250 μm square. In FIG. 7A, groups of patterns instead of actual patterns themselves are expressed in rectangular shape. FIG. 7B shows patterns in detail within parts of the sub-field region, 702, 703. In the two parts of the sub-field region, respectively, most of patterns are 70 nm line patterns, representing a minimum dimension of the LSI pattern. Patterns 704 represent one of patterns in a region where wiring is disposed in 70 nm line pattern in an equal line/space fashion while patterns 705 are 70 nm line patterns in a sparse pattern region.

With the present embodiment, pattern area density maps (not shown) are created by setting subdivided regions for effecting correction for the proximity effect due to backscattering to 10 μm each. Further, pattern area density maps are created by setting subdivided regions 50 μm square each for effecting correction for the local Coulomb effect within the respective sub-fields. With reference to one of the sub-fields, 701, distribution of pattern area density as expressed by a three-dimensional graph is shown in FIG. 7C. It is to be noted that for convenience of a viewer in seeing the figures, the x-axis direction and the y-axis direction, shown in FIG. 7A, are reversed in FIG. 7C. In creating a pattern area density map shown in FIG. 7C, weighted smoothing processing in nine adjacent subdivided regions is executed as shown by expression (19) given below in order to collect the effect of patterns in the adjacent subdivided regions.

$$a_i(i, j) = \sum_{l=-1}^{l=+1} \sum_{m=-1}^{m=+1} g(l, m) * a_0(l, m) \quad (19)$$

Herein, $\alpha_0$, $\alpha_1$ are a pattern area density before smoothing and that after the smoothing, respectively. Further, g (l, m) denotes a weighting factor, for which values found by expression 20 are used.

$g(0,0)=0.41$, $g(1,0)=g(-1,0)=g(0,1)=g(0,-1)=0.11$, $g(1,1)=g(-1,1)=g(1,-1)=g(-1,-1)=0.0275 \quad (20)$ FIG. 7D shows modifying mask pattern dimensions as obtained by taking into consideration the proximity effect, sub-field Coulomb effect and local Coulomb effect within the respective sub-fields. On the basis of such results as obtained, the patterns 704 are to be 52.5 nm in dimension, and the pattern 705 are to be 110 nm in dimension since a design dimension is 70 nm. As a mask for ¼-fold projection, patterns of a dimension 210 nm, 440 nm, respectively, were formed, and electron beam exposure was applied thereto, whereupon a result of a condition A shown in FIG. 7E. It was possible to obtain 70 nm patterns with reproducibility of dimension measurement, in a range of ±2 nm. Meanwhile, a condition B shown in FIG. 7E is the result of an experiment wherein correction of dimensions was conducted by taking into consideration only the proximity effect, and the sub-field Coulomb effect, but by ignoring the local Coulomb effect within the respective sub-fields. In this case, with the patterns 704 of a slightly higher pattern density, there was observed a dimensional error of +5 nm. Thus, it has become possible to correct dimensional errors due to nonuniform pattern disposition within the respective sub-fields with high precision by varying mask pattern dimensions with the use of three varieties of the pattern area density maps.

With the present embodiment, a layer of a relatively high pattern density, such as a wiring pattern, is described, however, with a logic LSI, an original pattern area density is low in a through-hole layer (or a contact hole layer), and the effect of the local Coulomb effect within the respective sub-fields is slight, so that it is sufficient to execute processing for implementing correction for the proximity effect and the sub-field Coulomb effect. Similarly, because a pattern area density is somewhat low in a gate layer of the logic LSI, it is often possible to be able to ignore the effect of the local Coulomb effect within the respective sub-fields. However, because dimensional precision required of gate patterns is generally severer than that for other layers of the LSI, it still becomes necessary to correct for the local Coulomb effect. The necessity of executing correction for the local Coulomb effect will be known by setting a maximum permissible error of local pattern area density and determining whether or not there exists a subdivided region where a local pattern area density exceeds the maximum permissible error. Further, in the case where division of data into complementary masks is required, there is the need for determining on the basis of a pattern area density in respective mask patterns as divided.

Embodiment 6

Figure 8A:
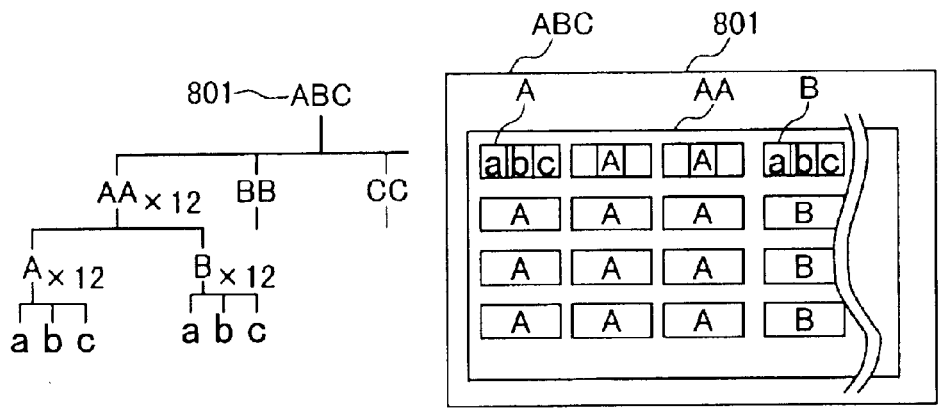
FIG. 8 shows views of a sixth embodiment of a method of forming patterns according to the invention, describing particularly a method of executing data processing for correction of the proximity effect, FIG. 8A being a conceptual view showing makeup of LSI pattern data, and FIG. 8B a flow chart of data processing.

In FIG. 8, there is illustrated a method of executing data processing for correction of the proximity effect, and so forth, by making the most of a hierarchical data structure for use in a design stage of a LSI. FIG. 8A is a conceptual view showing a top layer cell ABC (801) of LSI pattern data, and AA, BB, CC, etc., placed immediately thereunder. Further, a, b, c are placed underneath an AA lebel, thereby forming a hierarchical structure.

Figure 8B:
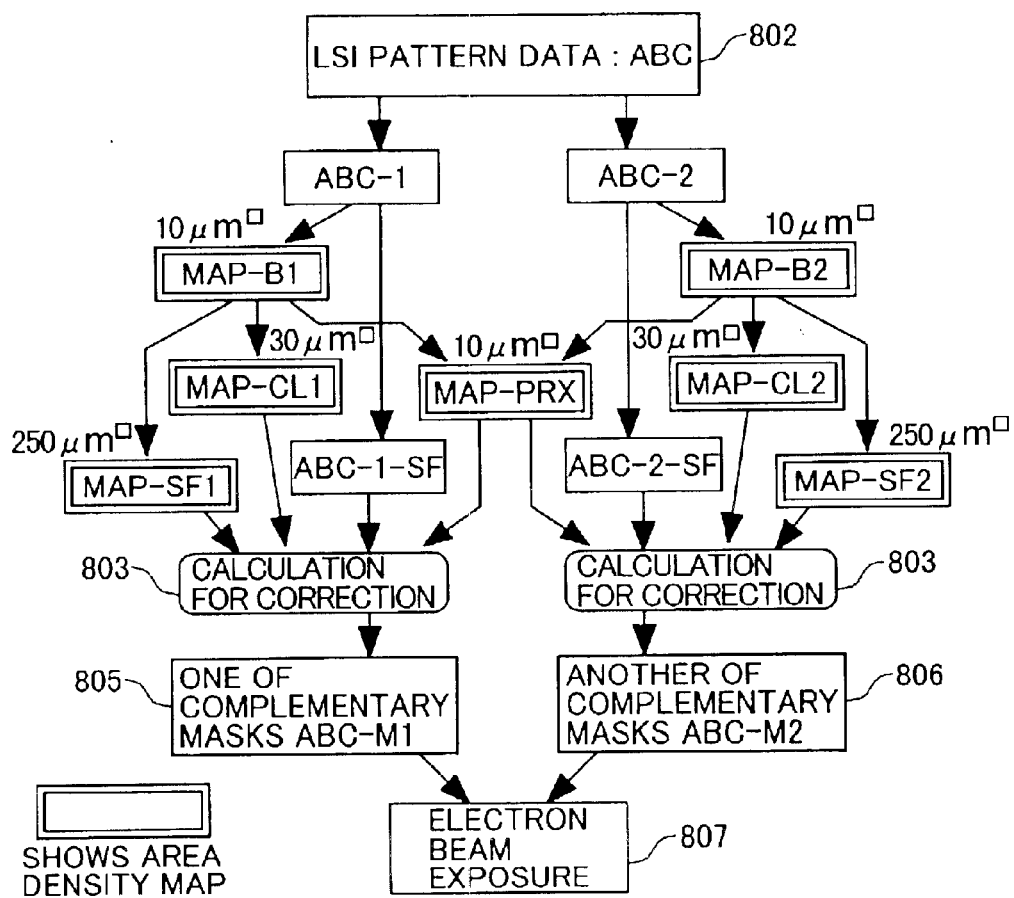

For execution of data processing with the hierarchical structure being maintained, it is desirable to execute division of data into sub-fields in a back-end step of processing, as later as possible. Accordingly, with the present embodiment, there is adopted a data process flow as shown in FIG. 8B. First, in the case where division of data into complementary patterns is required, LSI pattern data: ABC (802) is first divided into two complementary patterns ABC-1, and ABC-2. With the present embodiment, use was made of general-purpose software for LSI design rule check (DRC) to implement complementary pattern division. ABC-1, and ABC-2 retain most of the hierarchical structure.

Subsequently, patterns overlapped between cells within the divided pattern ABC-1 are integrated, thereby removing an overlapped portion. Thereafter, fundamental subdivided regions 10 μm are set, and a pattern area within the respective fundamental subdivided regions is calculated, thereby creating a fundamental pattern area density map MAP-B1. Further, pattern ABC-2 is similarly processed, and thereby a fundamental pattern area density map MAP-B2 is created.

Since a size of the fundamental subdivided region is rendered coincident with a subdivided region for correction of backscattering, 10 μm in size, a backscattering pattern area density map MAP-PRX can be created simply by addition of pattern area density values of subdivided regions at an identical position in MAP-B1 and MAP-B2, respectively.

Subsequently, on the basis of the fundamental pattern area density map MAP-B1, there are created a pattern area density map for correction of the local Coulomb effect, MAP-CL 1, with subdivided regions each 30 μm, and a pattern area density map for correction of the sub-field Coulomb effect, MAP-SF1, with subdivided regions each 250 μm. With reference to the other of the complementary patterns, a pattern area density map for correction of the local Coulomb effect, MAP-CL2, and a pattern area density map for correction of the sub-field Coulomb effect, MAP-SF2 are similarly created.

Then, in the case of dividing the pattern data ABC-1 (or ABC-2) into units of a sub-field 250 μm square, with cells in a closed structure within a sub-field, cells are retained as they are. In the case of cells in a lower level spreading across sub-fields, the makeup of the cells is varied as plural cells in a closed structure within a sub-field. Pattern data ABC-1-SF (or ABC-2-SF) retaining hierarchy within the sub-field is such a way are created. In executing calculation for correction on the basis of these pattern data and the pattern area density maps MAP-PRX, MAP-CL1, and MAP-SF1 (or MAP-CL2, and MAP-SF2), the method described in Embodiments 1 to 5, respectively, is employed. As a result of the calculation for correction, complementary mask data ABC-M1 (805) and ABC-M2 (806) are produced.

In this stage, most of the hierarchical cells are expanded to constitute a flat data structure. This is because even if cells are identical, an amount of dimensional correction varies depending on the disposition position thereof, so that it becomes impossible to compress data. However, depending on a LSI layer, for example, in parts of hole patterns or logic gates, there are regions where local pattern density within a sub-field is low, and in such regions within the sub-field, an amount of dimensional correction becomes constant, thereby enabling the hierarchy to be maintained. In this stage, outputting of ABC-M1 and ABC-M2 directly to the data format of an electron beam lithography system for mask writing is highly efficient. Electron beam exposure (807) is applied such that sub-fields at an identical position are projected at an identical position on a wafer by means of complementary masks for projection, fabricated by use of the data (805, 806).

As described above, as a result of executing division of data into complementary pattern data prior to sub-field division, data can be processed while retaining the hierarchical structure of the data as much as possible, so that the method according to the present embodiment is effective in speed-up of processing speed, and reduction in an amount of data to be processed. Needles to say, it is possible to retain the hierarchical structure of the data even if the division of data into complementary pattern data is executed after the sub-field division. In this case, however, there is a possibility that there occur an increase in the number of cells that are expanded into a flat structure depending on the structure of the original LSI data.

In the above-described processing of data, since the sub-field is 250 μm square in dimensions, 6400 pieces of sub-field data are produced for a LSI chip 20 mm square in dimensions. At this point in time, pattern data ABC-1-SF (or ABC-2-SF) may be retained as different 6400 files, however, if the whole data are retained in one file, and the sub-field data are kept as 6400 cells on the lower level, this will be convenient at the time of inputting or outputting the data.

Embodiment 7

Now, a specific method of fabricating a semiconductor IC device is described hereinafter by way of example. Herein, there is described a case where the invention is applied to a method of fabricating a semiconductor IC device comprising a gate array, standard cells, and so forth, to be fabricated on a semi-custom base, or a semiconductor IC device comprising a custom I/O (input/output) circuit, and custom logic circuit or an I/F (interface) control circuit, disposed on a semiconductor substrate.

FIG. 9A is a schematic plane view showing parts of logic elements of a semiconductor IC device. The parts are made up of two pieces of nMISQn and two pieces of pMISQp. The nMISQn is formed on an n-type semiconductor areas 911n on the surface of a p-type well region PW formed in a semiconductor substrate, and the pMISQp is formed on a p-type semiconductor areas 911p on the surface of an n-type well region NW formed in the semiconductor substrate, respectively. Gate electrodes 912A are common to the nMISQn and the pMISQp. The gate electrodes 912A are made up of, for example, a polycide gate structure with a silicide film formed on top of a single film of low resistance polysilicon or a low resistance polysilicon film, a polymetal gate structure with a metal film made of tungsten etc, deposited on top of a low resistance polysilicon film through the intermediary of a barrier film made of tungsten nitride etc., or a damascene gate structure constructed by depositing a barrier film, made of titanium nitride etc., in a groove dug in an insulating film and further, by embedding a metal film, made of copper etc., over the barrier film. The lower part of the gate electrodes 912A, in the semiconductor substrate, becomes a channel region.

Wiring 913A is a power source wiring on the side of, for example, high potential (for example, in the order of 3.3 V or 1.8 V) and is electrically connected to the p-type semiconductor areas 911p with the two pieces of pMISQp via a contact hole CNT. Further, wiring 913B is a power source wiring on the side of, for example, low potential (for example, in the order of 0 V), and is electrically connected to the n-type semiconductor areas 911n with the two pieces of nMISQn via a contact hole CNT. Wirings 913C are input wirings to gate circuits of a two-input NAND gate, and are in contact with wide parts of the gate electrodes 912A to be electrically connected thereto. Wiring 913D is electrically connected to both the n-type semiconductor areas 911n and the p-type semiconductor areas 911p via a contact hole CNT. Wiring 914A is electrically connected to the wiring 913D via a contact hole CNT.

FIG. 9B shows selective application of the step of using the EPL method based on the method of forming patterns according to the invention or the photolithography in the process of fabricating circuits in FIG. 9A. In the step of forming the n-type or p-type well region, fine dimensions are not required, and consequently, patterns were formed by the normal photolithography. In the step of forming element isolation layers, patterns were formed by creating a pattern area density map of backscattering (MAP 1), pattern area density map (MAP 2) of the Coulomb effect on the basis of a sub-field, and pattern area density map (MAP 3) of the local Coulomb effect within the respective sub-fields besides a fundamental pattern area density map, and by application of two complementary masks with which correction of errors in these maps was executed. Subsequently, after the formation of grooves by etching a silicon substrate, a silicon oxide film was embedded, thereby executing smoothing thereof was by CMP (Chemical Mechanical Polishing). Subsequently, in the step of forming a gate, correction in pattern shape was executed by use of a pattern area density map (MAP 4) of process effect in addition of MAP 1, MAP 2, and MAP 3 in order to correct dimensional fluctuation due to the loading effect of dry etching. Further, by dividing into the two complementary masks to reduce the Coulomb effect, and superimposing one on the other at the time of electron beam exposure, predetermined patterns are obtained.

In the step of forming the contact hole, modification of patterns was executed by use of MAP 1 and MAP 2 only without dividing into the two complementary masks. The same applies to the later step of forming a through-hole 1. In the step of depositing a metal wiring 1, division into the two complementary masks was executed in order to secure sufficient mechanical strength of a stencil mask because there exist regions of relatively high pattern area density, and long wirings. For modification of patterns to implement correction, MAP 1, MAP 2, and MAP 3 were employed. Subsequent steps include those for a metal wiring 2, a through-hole 2, a metal wiring 3, a through-hole 3, a metal wiring 4, a through-hole 4, a metal wiring 5, a through-hole 5, and protection thereof, and in all those steps, pattern dimensions are large as compared with gate electrode patterns, so that patterns were formed by the photolithography.

The invention described above is concerned with the fabrication of semiconductor devices, but application of the method is not limited particularly thereto. With the use of the same method, the invention is applicable to devices wherein patterns are projected onto a sensitizing substrate by irradiating the same with a high energy beam, including, for example, a liquid crystal display device.

Embodiment 8

Figure 10:
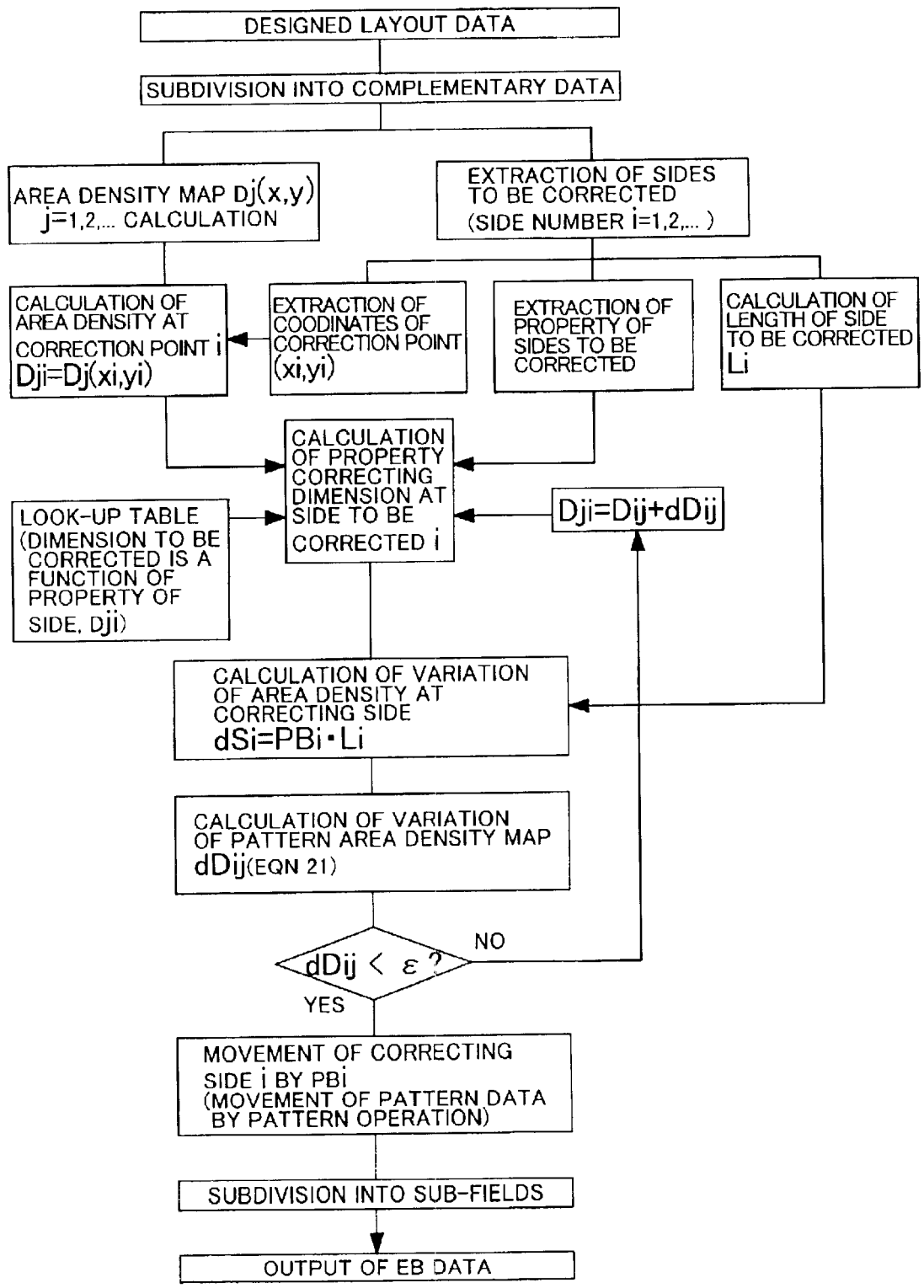
FIG. 10 is a flow chart of an eighth embodiment of a method of forming patterns according to the invention, describing particularly a DA system for use in mask correction.
Figure 11:
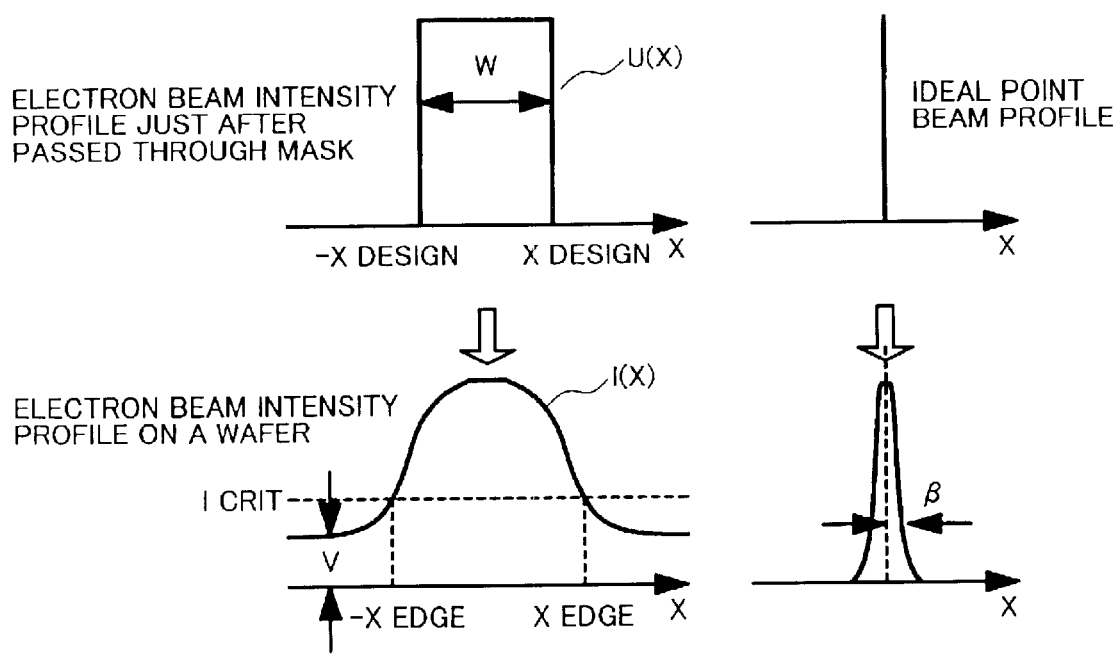
FIG. 11 is a schematic diagram describing a method of preparing a look-up table for use in carrying out the embodiments of the invention.

With the present embodiment, a DA system for use in mask correction is described hereinafter by way of example with reference to FIG. 10.

First, designed layout data including semiconductor circuit patterns as desired is inputted, and is divided into data for complementary mask patterns P1, P2, respectively. It is desirable to create also divided side pattern data PD and sub-field boundaries newly as pattern data at the same time. However, in this stage, division of data into sub-fields is not executed. With reference to the above-described pattern data, pattern area density maps { in this case, use is made of a backscattering map D1 (x, y), a Coulomb effect map D2 (x, y), and a wafer process map D3 (x, y)} based on plural varieties of subdivided regions are created by the substantially same method as that described in the preceding embodiment.

Subsequently, respective sides of patterns included in design pattern P or the complementary mask patterns P1, P2 are divided as appropriate, thereby extracting and numbering sides to be corrected and correction points. The correction points are set substantially at the center of the respective sides to be corrected. Further, the property of the respective sides to be corrected is classified as necessary. With respect to a dimension (a width of a part allowing transmission of an electron beam) of a pattern to which a side belongs, a length of a side, a distance up to adjacent patterns, functions of a side, within a pattern (long side, line edge, hole, etc.), and so forth, all the sides are categorized. In such categorization, there has been adopted pattern extraction by pattern operation software, currently in widespread use for correction of an optical proximity effect. In this connection, it is not necessarily required to categorize all items described as above. For example, there can be a case where sufficient accuracy is obtained through categorization by only the dimension of patterns, and the functions of a side. With reference to the respective sides to be corrected (side number i=1, 2, 3 . . . ), a corresponding table for coordinates of the correction points, lengths of the respective sides, and properties of the respective sides is stored in a memory.

Three varieties of pattern area densities $D1i$, $D2i$, $D3i$ at an i-th correction point are worked out by approximation through interpolation on the basis of the pattern area density maps D1 (x, y), D2 (x, y), and D3 (x, y). Herein, D1i value represents an approximation found by convolution of a first distribution function $fj(x-xi, y-yi)$ centering on a pattern and the coordinates (xi, yi) of the i-th correction point, that is, an effective pattern area density contributing to backscattering within a range of radius r1 (backscattering range) substantially centering around the correction point described. Herein, the function f1 is the same as that shown by the expression (5) for Embodiment 2. Similarly, $D2i$, $D3i$ represent a pattern area density within a range affected by the local Coulomb effect, and a range affected by the loading effect at the time of etching, respectively, centering around the correction point described.

Subsequently, a dimension to be corrected at the respective correction points, that is, an amount of movement of a side to be corrected is established from $D1i$, $D2i$, and $D3i$. In this case, depending on the properties of sides to be corrected, and D1, D2, and D3, optimum dimensions to be corrected, PB, are calculated beforehand, and a look-up table is prepared beforehand, thereby making a decision on dimension to be corrected for each of the correction points by referring to the look-up table. A method of creating the look-up table will be described later. Further, pattern area density variation dSi, accompanying correction, is calculated by (length Li of a side to be corrected x a dimension to be corrected Pbi) for every side to be corrected. A corresponding table for the dimensions to be corrected, found as above, variation in pattern area density, and correction points as necessary is created, and stored in the memory.

In the case where variation in pattern area or pattern area density, accompanying correction, is sufficiently small, the respective sides to be corrected are caused to move on the pattern data by the dimension to be corrected. Movement of data on the sides is implemented by normal processing for pattern operation. As for processing of extremities of sides, it is desirable to execute processing as appropriate so as not to cause unnecessary projection or recess in the same way as adopted normally in correction for the optical proximity effect.

Variation dDj (x, y) (j=1, 2, 3) in the respective pattern area density maps, accompanying the pattern area density variation dSi caused by movement of the respective sides to be corrected, can be calculated as follows. The variation described, however, is expressed as a continuous function herein.

$$dDj(x, y)=\Sigma dSi\cdot fj(x-xi, y-yi) \tag{21}$$

{the sum is found with respect to all the correction points or correction points in close proximity of (x, y)} A pattern area density at the respective correction points after correction is found by expression (22):

$$D'ji=Dji+dDj (xi, yi) \tag{22}$$

In the case where variation in pattern area or pattern area density, accompanying correction, is not negligible, a dimension to be corrected is reset by use of plural pattern area densities recalculated by the above-described expression with reference to the respective correction points, and by referring again to the look-up table. The above-described step is repeated thereafter until the variation in pattern area or pattern area density, accompanying correction, becomes sufficiently small. After finally deciding in this way on a dimension to be corrected as to the respective sides to be corrected, the respective sides to be corrected are caused to move on the pattern data by the dimension to be corrected through the processing for pattern operation.

Thereafter, after executing subdivision into sub-fields, the pattern data is outputted as EB writing data, a stencil mask for use in an electron beam projection aligner is written with the EB writing data before fabrication, and a resist film on a semiconductor substrate is subjected to electron beam exposure and development, thereby forming semiconductor circuit patterns as desired. Further, when fabricating the stencil mask by means of electron beam exposure, correction of the proximity effect for mask writing is required. In this case, pattern area density maps for correction of backscattering and the proximity effect, used in the mask writing, together with D1, D2, and D3, were created from the fundamental pattern area density map, and based on these maps, drawing was implemented. As a result, it was possible to form patterns having dimensions exactly as corrected.

With the present embodiment, an optimum dimension to be corrected, corresponding to the properties of a pattern, can be established quite rapidly through categorization of the pattern, by pattern operation, and high-speed reference to the table. Further, an optimum dimension to be corrected, corresponding to the position of a side to be corrected, can be approximated through interpolation with high precision from a pattern area density map of relatively sparse patterns. Still further, variation in pattern area density can be easily calculated from a length of respective sides, and a dimension to be corrected, so that convergent calculation for the optimum dimension to be corrected can be executed without actually carrying out pattern modification.

Now, a method of fixing the look-up table is described hereinafter by taking an example of a line pattern for brevity (referring to FIG., 11). Electron beam intensity profile after passing through a line mask pattern having a width W is designated U (x). Herein, a simple step function is assumed as U (x). If a distribution function of electron beam blur, not dependent on a pattern, is designated Bf (x) a distribution function of the blur, due to the Coulomb effect (dependent on a pattern area density), is designated Bc(x), and intensity of overlapping electron beam due to backscattering is designated V, electron beam intensity profile I(x) on a wafer is given approximately by the following expression 23:

$$I(x) = U(x)(*)Bf(x)(*)Bc(x)+V \quad (23)$$
$$= U(x)(*)gauss(\beta f^2+\beta c^2)^{0.5})+V$$

where (*) represents convolution.

In this case, spreads $\beta f$, $\beta c$ of the two blurs described, respectively, are assumed to be based on distribution of Gaussian function. It is to be noted that the profile I(x) is the function of W, $\beta f$, $\beta c$, and V. Accordingly, assuming that an edge of a resist pattern after development is dependent on x=X edge, rendering I(x)=I crit, X edge as well becomes the function of W, $\beta f$, $\beta c$, and V. Assuming that $\beta=(\beta f^2+\beta c^2)^{0.5}$ for brevity, the following holds.

$$X\ edge=f(W, \beta, V) \quad (24)$$

Assuming that a design line edge position is X design, deviation from a design value is expressed by X edge-X design, so that an optimum bias amount PB (an amount of movement of a side) is found by the following expression.

$$PB=-(X\ edge-X\ design)/MEF \quad (25)$$

where MEF is an amount, called the mask error factor, representing a ratio of actual variation of a resist dimension to variation of a mask dimension, and is established by the following expression (a dimension on a mask is converted to a scaled-down dimension on a wafer).

$$MEF=[f(W+dW, \beta, V)-f(W, \beta, V)]/(2 \cdot dW) \quad (26)$$

Therefore, the following holds.

$$PB=[f(W, \beta, V)-X\ design]/[f(W+dW, \beta, V)-f(W, \beta, V)] \cdot (2 \cdot dW) \quad (27)$$

The bias PB is calculated beforehand against variables of W, $\beta$, and V, thereby creating a three-dimensional table. With the present embodiment, MEF is calculated by the expression given as above, thereby finding the bias PB. However, for brevity, the same may be approximated as follows:

$$PB=-(X\ edge-X\ design) \quad (28)$$

Further, a similar table may be also created for a hole pattern, and a line edge. In addition, in the case where there exist adjacent patterns in the vicinity, the effect thereof can be collected by setting U (x) of the expression (23) variously against I(x). Thus, selective use of the tables, depending on categorization of the properties of sides, executed at the time of extraction of the correction point, enables correction with quite high precision.

Embodiment 9

With the present embodiment, there is described a method of finding variation in dimension for every correction point through simplified simulation of an electron beam projection image, and thereby calculating a bias correction amount. According as space between opening patterns becomes closer to an extent of an electron beam blur due to the Coulomb effect following pattern micronization, the condition of adjacent patterns will come to affect dimensions dependently on the Coulomb effect, so that there arises the need for taking this effect into consideration more accurately. These effects can be coped with by executing more elaborately classification (particularly, classification of the property of the respective sides) with the look-up table as in the case of Embodiment 8, however, there arises a problem in that the look-up table then becomes massive.

With the present embodiment, there is therefore performed simulation of electron beam intensity distribution in the vicinity of every correction point to find a deviation in the position of an edge to be corrected, and an optimum dimension to be corrected is calculated. The electron beam intensity distribution I (x, y) can be calculated by substituting a two-dimensional distribution U (x, y) of the opening patterns of a mask for U (x) of the expression (23). Herein, values of $\beta$, V, respectively, are values calculated for every correction point on the basis of plural pattern area density maps as with the case of Embodiment 8, or values of a subdivided region to which the relevant correction point belongs.

Various known computation models concerning the effect of diffusion of acid and quencher in a resist, development, and so forth may be added. As for the method of finding the optimum dimension to be corrected from the electron beam intensity distribution after simulation, it is possible to employ a method adopted by the technique well known for its capability to effect correction of optical proximity effect on a model base or simulation base.

To implement correction, there is no need for calculating the electron beam intensity distribution I (x, y) in the entire region, and it will suffice to perform calculation for 3 to 5 sampling points centering on, and in the vicinity of the correction point (xi, yi). The method according to the invention differs in respect of correction for the optical proximity effect from conventional methods in that physical significance of a projection image on which correction is based is different, and in addition, the projection image is dependent on the plural pattern area density maps, so that the projection image varies depending on the position thereof even if it is of an identical pattern.

As described above, with the invention, there is described the method of implementing fast and highly accurate correction of the effects of plural error factors by utilizing the plural pattern area density maps. The embodiments described represent merely several examples, and the invention is not to be limited thereto. Degradation of dimensional precision of patterns is caused not only at the time of projection by the electron beam, but also at other times, so that there is a possibility that an error occurs in the step of fabricating a mask, depending on an exposure mode, and a substrate structure.

Since electron beam lithography is often employed in mask writing, processing even in this stage is affected by the proximity effect. In such a case, correction can be implemented by creating additional different pattern area density maps. In this case, correction of the proximity effect, taking into consideration demagnification at the time of projection by the electron beam is evidently required.

In contrast to an optical system, it is difficult with an illumination system by electron beam exposure to provide uniform illuminance by use of a wide-angle lens. Accordingly, there can occur a problem of nonuniformity in illuminance within a range (sub-field) of exposure en bloc by an electron beam. Even in such a case where nonuniformity exists within the sub-field, modification of patterns can be implemented by creating a two-dimensional map equivalent to the pattern area density maps.

Since speed-up of processing described hereinbefore can be implemented with higher precision through repeated computation to find optimum dimensions of pattern modification, the invention is capable of meeting severe dimensional precision required of future LSIs, thereby making significant contribution to improvement in performance of the LSIs.

What is claimed is:

1. A method of forming patterns wherein a region that can be exposed by an electron beam at one time is defined as a sub-field, and predetermined patterns are formed by exposing sequentially the sub-field at predetermined positions on a substrate to be processed through deflection of the electron beam, said method comprising:

a step of creating a first pattern area density map, wherein a whole region of the predetermined patterns is divided into a plurality of first subdivided regions of constant dimensions, a ratio of a pattern area through which the electron beam passes, within one of the first subdivided regions, to one of the first subdivided regions, in whole, is defined as a pattern area density, and pattern area densities for the whole region of the predetermined patterns are rendered into two-dimensional array data made up so as to correspond to each of the first subdivided regions;

a step of creating a second pattern area density map, wherein a value calculated on the basis of the pattern area densities of several of the first subdivided regions is a pattern area density of second subdivided regions; and a step of applying exposure such that a deflection position of the sub-field and current density of the electron beam substantially coincide with a deflection position of the sub-field and current density of the electron beam as estimated at the time of exposing the sub-field, with the use of a mask for projection to which modification of patterns is applied by estimating variation in pattern dimensions after electron beam exposure and development by taking into consideration an effect of backscattering of the electron beam, inside the substrate to be processed, by use of an extent of electron beam blur dependent on the deflection position of the electron beam at the time of exposing the sub-field, as corrected on the basis of the first or second pattern area density map and the current density of the electron beam, and by use of a third pattern area density map different from the first and second pattern area density maps.

2. A method of forming patterns according to claim 1, wherein dimensions of pattern modification are established on the basis of dimensions of pattern modification allowing for variation in dimensions, taking place in the step of developing a latent image formed in a resist due to the electron beam exposure or in the step of processing the substrate by use of a resist pattern, as pre-estimated with the use of a fourth pattern area density map different from the first, second, and third pattern area density maps.

3. A method of forming patterns according to claim 1, wherein the second subdivided region is one of the sub-fields, in whole, and pattern data, for use in fabrication of the mask for projection, includes modification in dimensions of patterns, found by pre-estimating the extent of the electron beam blur, due to Coulomb effect dependent on current in one of the sub-fields, in whole, on the basis of a pattern area density of the respective sub-fields and aberration of an electron beam optical system, at a position of the respective sub-fields.

4. A method of forming patterns according to claim 3, wherein the extent of the electron beam blur at the position of the respective sub-fields is found by use of an approximate expression represented by the function of a distance from the center of deflection of the respective sub-fields and a current value of the respective sub-fields.

5. A method of forming patterns according to claim 3, wherein the pattern data includes patterns modified in dimensions by pre-estimating distribution of local electron beam blur within the respective sub-fields by use of the second pattern area density map.

6. A method of forming patterns according to claim 1, wherein in the step of creating the pattern area density maps, elements within the respective second subdivided regions of the second pattern area density map are found by collecting effects of the second subdivided regions surrounding the second subdivided region of interest on the relevant second subdivided region.

7. A method of forming patterns according to claim 1, wherein if variation in pattern area density of one of the first subdivided regions of the first pattern area density map, caused by correction made to dimensions of the patterns, is greater than a predetermined value, the dimensions of the pattern are corrected again on the basis of a pattern area density map created according to the dimensions of the patterns as corrected.

8. A method of forming patterns according to claim 7, wherein after correction of the dimensions of the patterns, variation of respective pattern areas, accompanying the correction of the dimensions of the patterns, is calculated, and on the basis of the variation of the respective pattern areas, variation of respective elements within the respective first subdivided regions of the first pattern area density map is found, whereupon if the variation of respective elements is greater than a predetermined value, a corrected pattern area density map is created by adding the variation of respective elements to the respective first subdivided regions, and on the basis of the corrected pattern area density map, the dimensions of the patterns are corrected.

9. A method of forming patterns according to claim 7, wherein a perimeter of the respective patterns within the subdivided regions for finding pattern area densities is retained, and on the basis of a corrected amount of the dimensions of the patterns and the perimeter of the patterns, variation of respective pattern areas is calculated.

10. A method of forming patterns according to claim 1, wherein a corrected amount of the dimensions of the patterns is decided upon (by a look-up table for correction or an approximate equation), correlating a backscattering level calculated from the third pattern area density map with the extent of the electron beam blur calculated from the second pattern area density map or plural pattern area density maps, properties of pattern sides to be corrected, and dimensions of pattern modification.

11. A method of forming patterns according to claim 1, wherein properties of pattern sides to be corrected include any of a length of long sides, a length of short sides, and a width of the patterns.

12. A method of forming patterns according to claim 1, further comprising a step of forming the predetermined patterns by overlapping of exposure by the electron beam passing through plural masks, and creating a individual mask pattern area density map comprising patterns corresponding to the respective masks, and a step of creating a composite pattern area density map by adding elements within the respective subdivided regions at identical positions in the individual mask pattern area density map thereto, wherein the individual mask pattern area density map is employed for calculation of the extent of the electron beam blur, and the composite pattern area density map is employed for calculation of the effect of backscattering of the electron beam.

13. A method of forming patterns according to claim 1, further comprising a step of forming the predetermined patterns by overlapping of exposure by the electron beam passing through plural masks, and creating a individual mask pattern area density map comprising patterns corresponding to the respective masks, and a step of creating an integrated pattern area density map by merged patterns corresponding to the respective masks, wherein the individual mask pattern area density map is employed for calculation of the extent of the electron beam blur, and the integrated pattern area density map is employed for calculation of the effect of backscattering of the electron beam.

14. A method of fabricating a semiconductor device, using a method of forming patterns comprising:
    a step of creating a first pattern area density map by setting a plurality of first subdivided regions of first dimensions in a layer of a whole circuit pattern region of a semiconductor circuit, and calculating a pattern area within the respective first subdivided regions;
    a step of creating a second pattern area density map by setting second subdivided regions different from the first subdivided regions, and calculating a pattern area within the respective second subdivided regions from the first pattern area density map already created;
    a step of creating a third pattern area density map by setting third subdivided regions different from the second subdivided regions, and calculating a pattern area within the respective third subdivided regions from the first pattern area density map already created; and
    a step of correcting pattern dimensions by pre-estimating dimensions of pattern modification upon taking into consideration an effect of backscattering of a projection electron beam by use of the second pattern area density map, and an effect of blur of the projection electron beam by use of the third pattern area density map, wherein a circuit pattern as desired is formed by irradiating a semiconductor substrate with a resist applied thereto with an electron beam, using a mask for projection by the electron beam, fabricated with the use of data of the patterns formed.

15. A method of fabricating a semiconductor device according to claim 14, further comprising a step of dividing a layer of the circuit pattern into sub-field units when a region that can be exposed by the electron beam at one time is defined as a sub-field, and subdividing a pattern within the respective sub-fields into a plurality of complementary sub-fields, wherein the effect of backscattering of the projection electron beam is calculated by use of a pattern area density map taking into consideration whole patterns within the respective sub-fields and sub-fields in close proximity thereto while the effect of blur of the projection electron beam is calculated by use of a pattern area density map created on the basis of the complementary sub-fields as divided, and the mask for projection by the electron beam is formed at positions differing on the basis of the respective sub-fields and respective complementary patterns, so that upon irradiation by the projection electron beam, a circuit pattern as desired is formed by overlaying the respective complementary sub-fields of identical positions at identical positions on the semiconductor substrate before exposure.

16. A method of fabricating a semiconductor device according to claim 15, wherein while retaining at least a portion of a hierarchical structure used in a design stage of pattern data for the semiconductor device, the pattern data is divided into the respective complementary patterns before execution of modification of the patterns for division thereof into the respective sub-fields and correction of the proximity effect.

17. A method of fabricating a semiconductor device according to claim 14, further comprising a step of dividing a layer of the circuit pattern into complementary patterns when a region that can be exposed by the electron beam at one time is defined as a sub-field, and subdividing the respective complementary patterns into sub-field units having identical subdivided positions, wherein an effect of backscattering of the electron beam is calculated by use of a pattern area density map taking into consideration whole complementary patterns within sub-fields of interest and sub-fields in close proximity thereto while an effect of blur of the electron beam is calculated by use of a pattern area density map created on the basis of respective complementary sub-fields as divided, and the mask for projection by the electron beam is formed at positions differing on the basis of the respective sub-fields and respective complementary patterns, so that upon irradiation by the electron beam, a circuit pattern as desired is formed by overlaying the respective complementary sub-fields of identical positions at identical positions on the semiconductor substrate before exposure.

* * * * *